US010340857B2

(12) United States Patent
Matsuno et al.

(10) Patent No.: US 10,340,857 B2
(45) Date of Patent: Jul. 2, 2019

(54) AMPLIFIER CIRCUIT

(71) Applicant: TOSHIBA MEMORY CORPORATION, Minato-ku, Tokyo (JP)

(72) Inventors: Junya Matsuno, Kawasaki Kanagawa (JP); Kazuyoshi Muraoka, Yokohama Kanagawa (JP); Masami Masuda, Chigasaki Kanagawa (JP); Yuui Shimizu, Yokohama Kanagawa (JP); Masatoshi Kohno, Kawaguchi Saitama (JP); Masahiro Hosoya, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 5 days.

(21) Appl. No.: 15/699,868

(22) Filed: Sep. 8, 2017

(65) Prior Publication Data

US 2018/0254750 A1    Sep. 6, 2018

(30) Foreign Application Priority Data

Mar. 2, 2017   (JP) .................................. 2017-039242

(51) Int. Cl.
*H03F 3/45*   (2006.01)
*H03F 1/08*   (2006.01)
(Continued)

(52) U.S. Cl.
CPC ........... *H03F 1/083* (2013.01); *H03F 1/0266* (2013.01); *H03F 1/086* (2013.01); *H03F 1/223* (2013.01);
(Continued)

(58) Field of Classification Search
CPC .... H03F 3/45; H03F 3/45179; H03F 3/45183; H03F 3/45188; H03F 3/45192;
(Continued)

(56) References Cited

U.S. PATENT DOCUMENTS 5,561,396 A    10/1996  Hogervorst et al.
5,631,607 A    5/1997   Huijsing et al.
(Continued)

FOREIGN PATENT DOCUMENTS

EP    083558 A1    4/1998
JP    10502788 A   3/1998
JP    10163848 A   6/1998

*Primary Examiner* — Knanh V Nguyen
(74) *Attorney, Agent, or Firm* — Holtz, Holtz & Volek PC

(57) ABSTRACT

According to one embodiment, the amplifier circuit includes a first and second differential amplifier. The first differential amplifier includes first and second transistors, a first current source, and a second current source that is configured to supply a current to the first and second transistors via a first switch element. The second differential amplifier includes third and fourth transistors, a third current source, and a fourth current source that is configured to supply a current to the third and fourth transistors via a second switch element. A first signal is input to the first and third transistors. The first switch elements are controlled by third and fourth signals, respectively. The third signal and the fourth signal are complementary.

20 Claims, 16 Drawing Sheets

(51) Int. Cl.
  *H03F 1/02*    (2006.01)
  *H03F 1/22*    (2006.01)
  *H03K 17/18*   (2006.01)
  *H03F 1/32*    (2006.01)
  *H03F 3/72*    (2006.01)

(52) U.S. Cl.
  CPC ......... *H03F 1/3211* (2013.01); *H03F 3/4521* (2013.01); *H03F 3/45076* (2013.01); *H03F 3/45183* (2013.01); *H03F 3/72* (2013.01); *H03K 17/18* (2013.01); *H03F 2200/405* (2013.01); *H03F 2203/45506* (2013.01)

(58) Field of Classification Search
  CPC ...... H03F 2200/177; H03F 1/307; H03F 3/30; H03F 3/3001; H03F 3/3022; H03F 2203/30009
  USPC ......................................... 330/253, 255, 261
  See application file for complete search history.

(56) References Cited

U.S. PATENT DOCUMENTS

| | | | | |
|---|---|---|---|---|
| 8,018,282 | B2* | 9/2011 | Liang ................... | H03F 3/3022 |
| | | | | 330/261 |
| 8,044,950 | B2* | 10/2011 | Satou ................... | G09G 3/3688 |
| | | | | 327/112 |
| 9,275,595 | B2* | 3/2016 | Kim ..................... | G09G 3/3685 |
| 2012/0019502 | A1* | 1/2012 | Kawagoshi .......... | G09G 3/3688 |
| | | | | 345/211 |

* cited by examiner

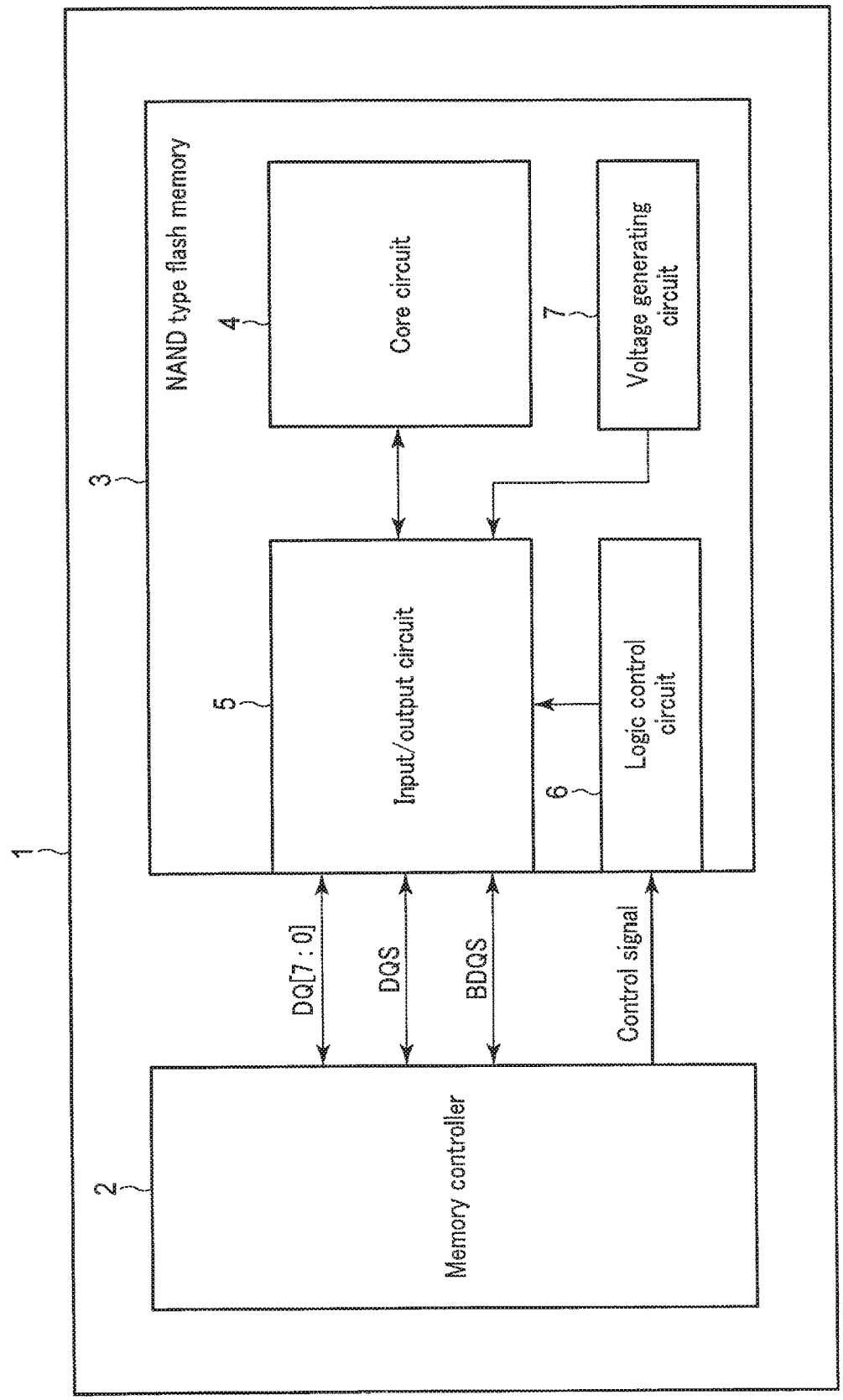
F I G. 1

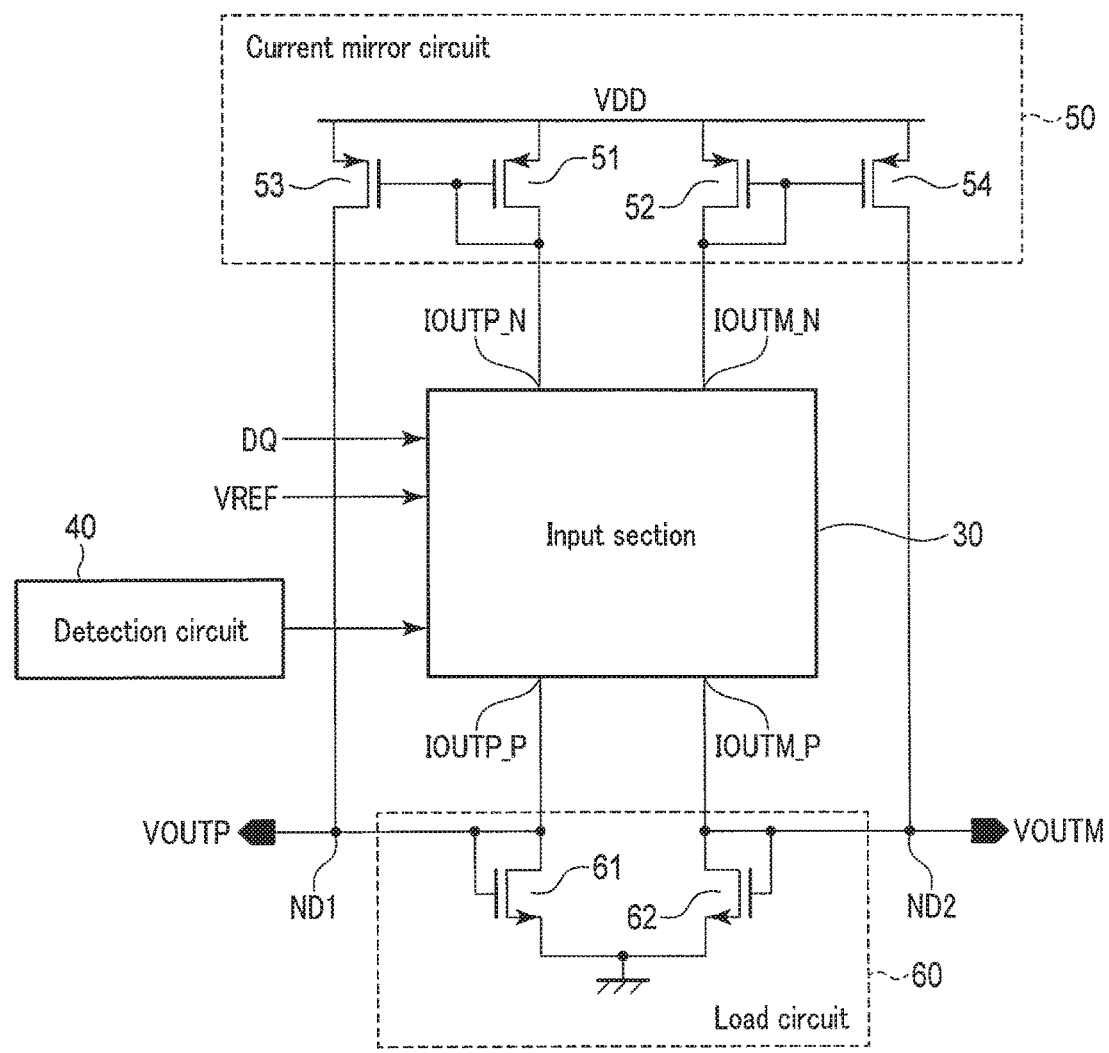
F I G. 3

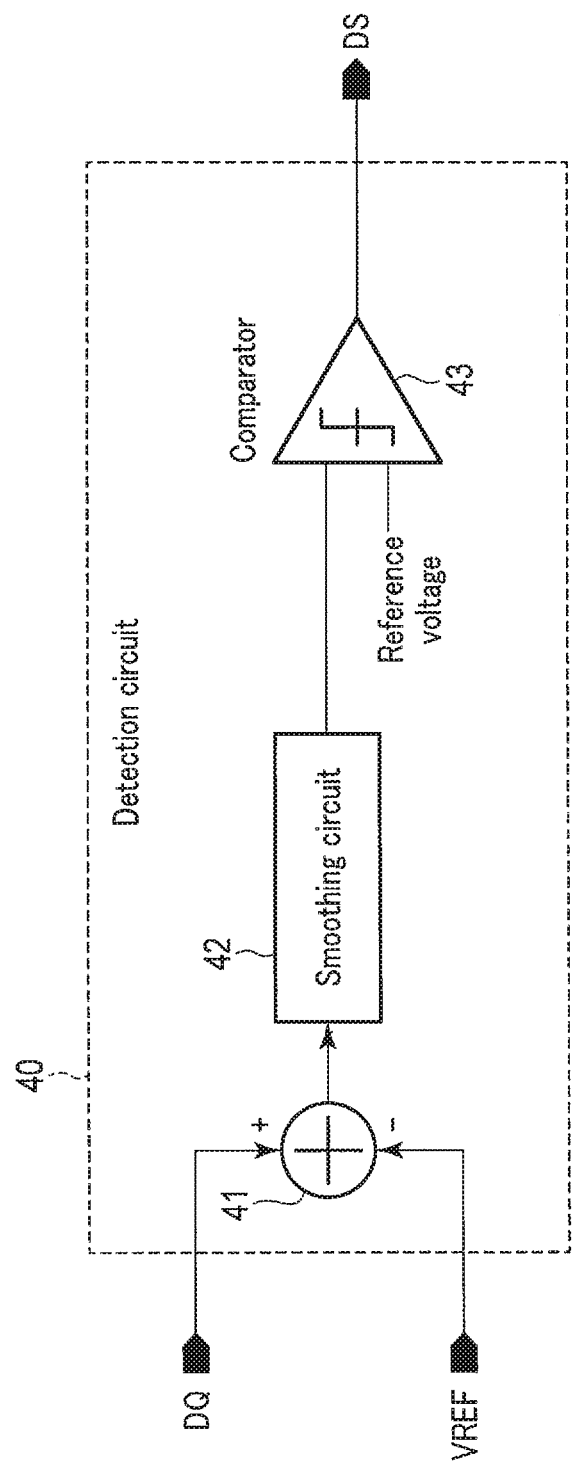
F I G. 5

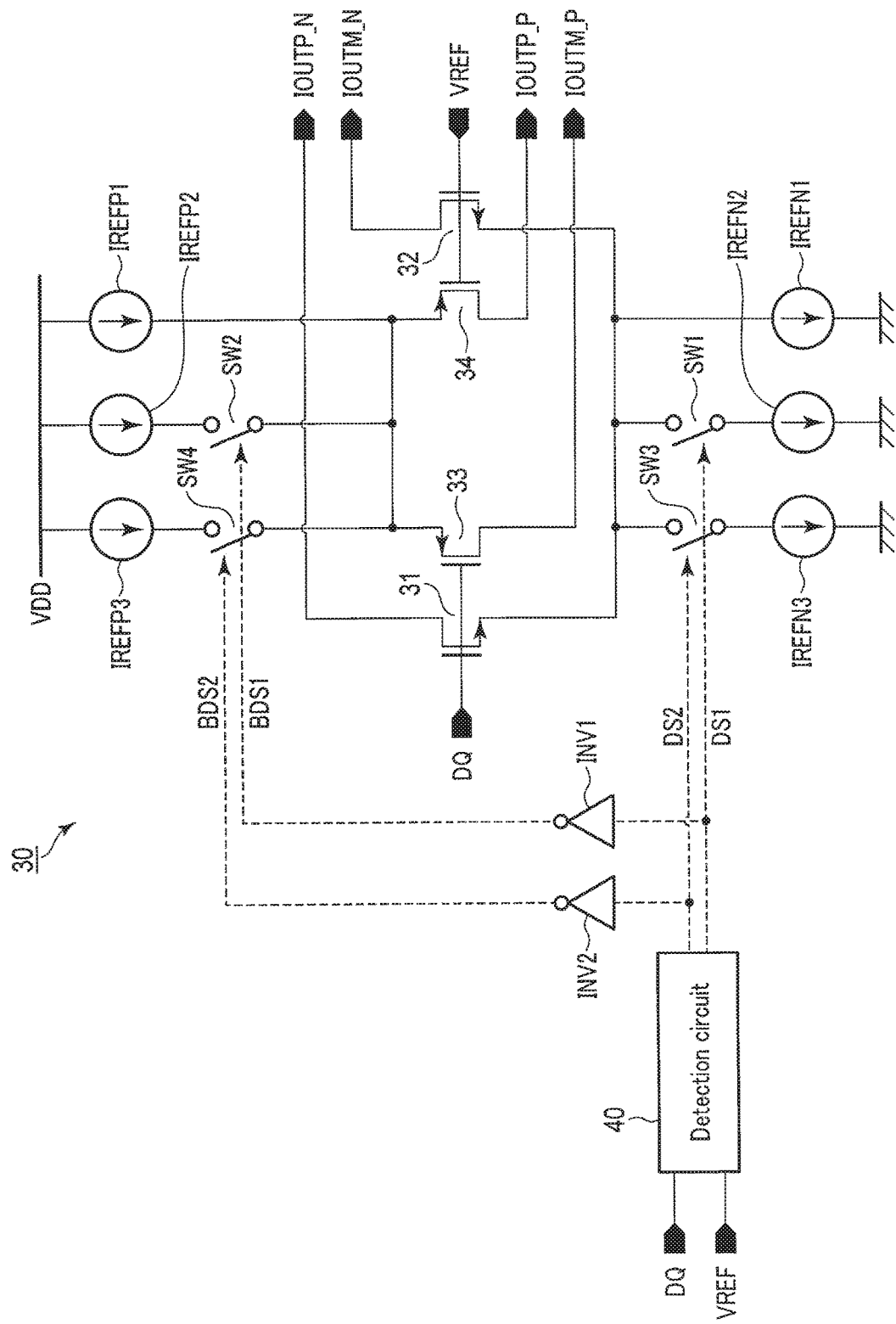
F I G. 8

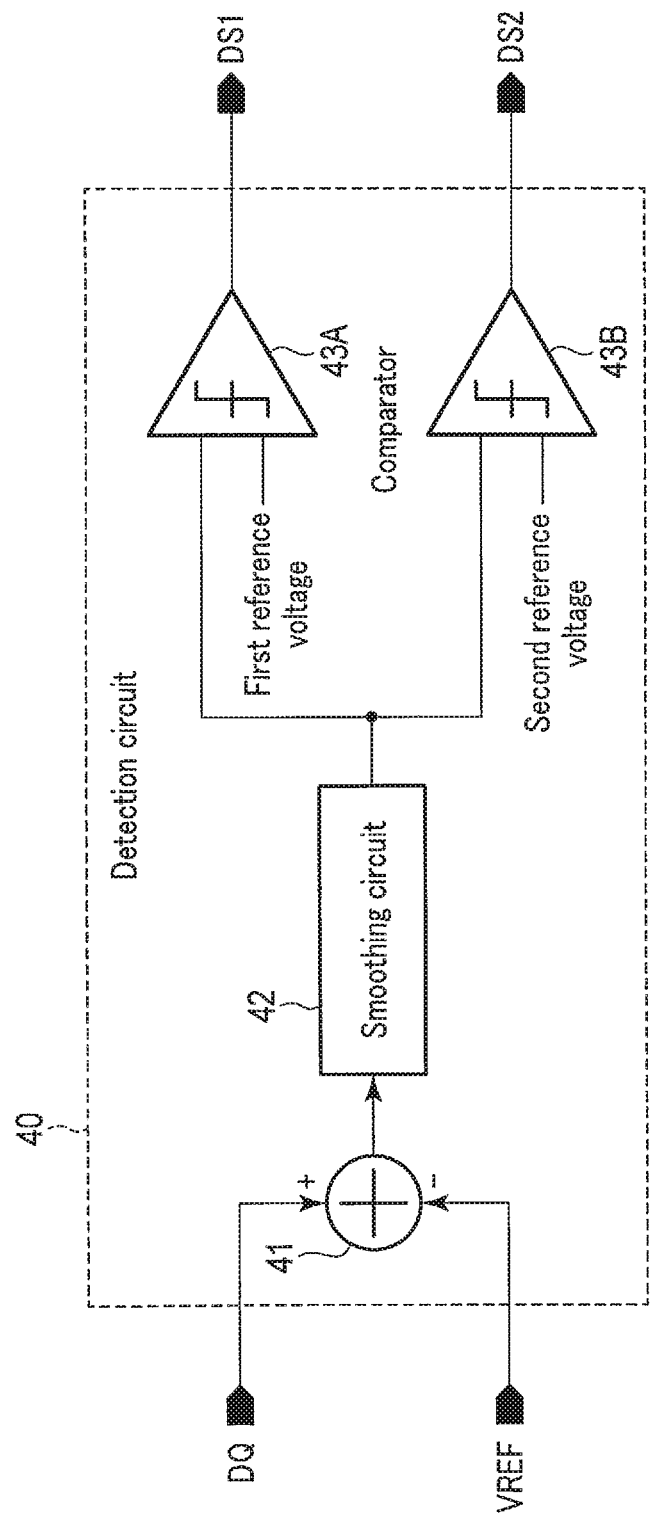
F I G. 9

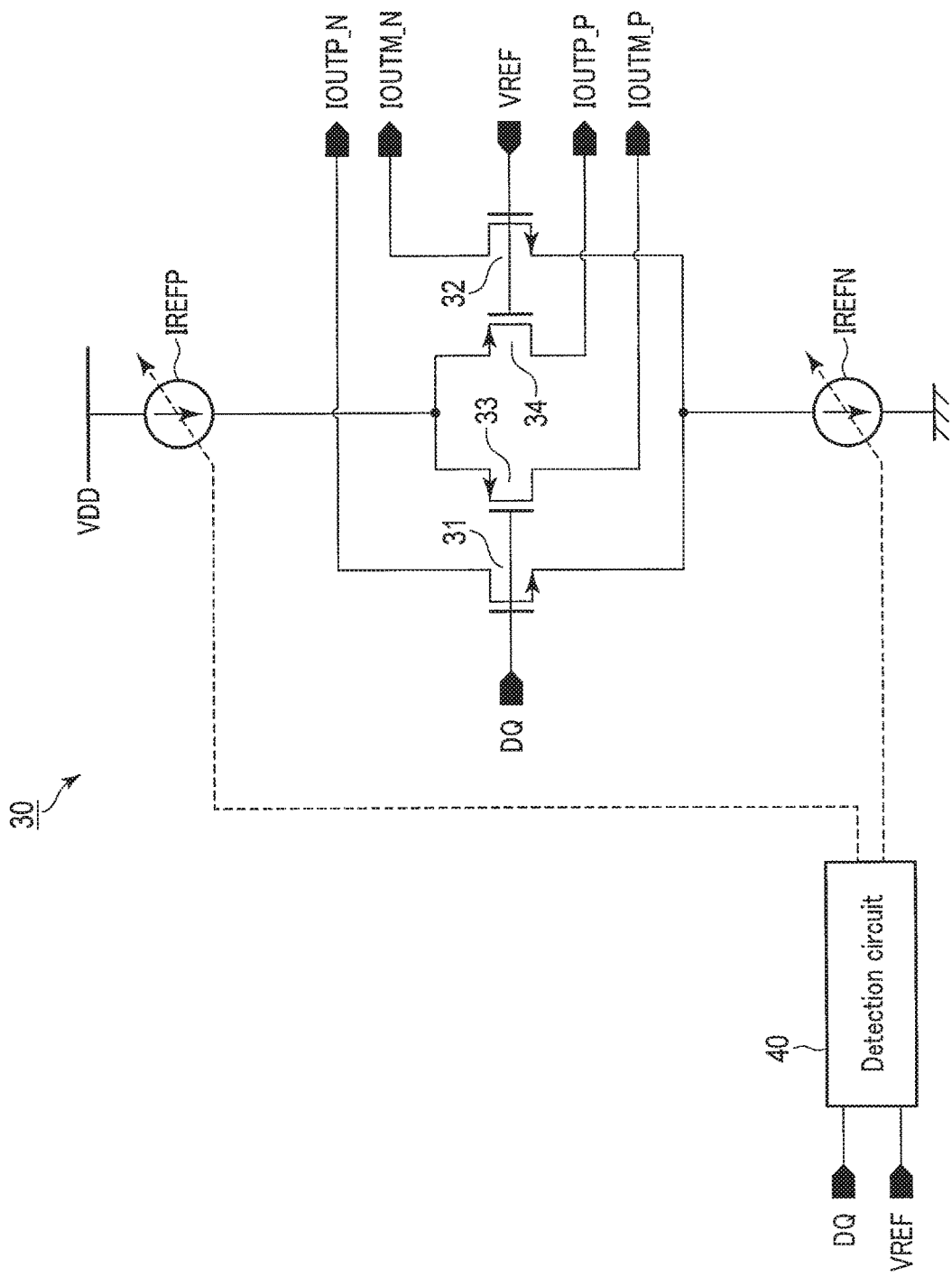
F I G. 11

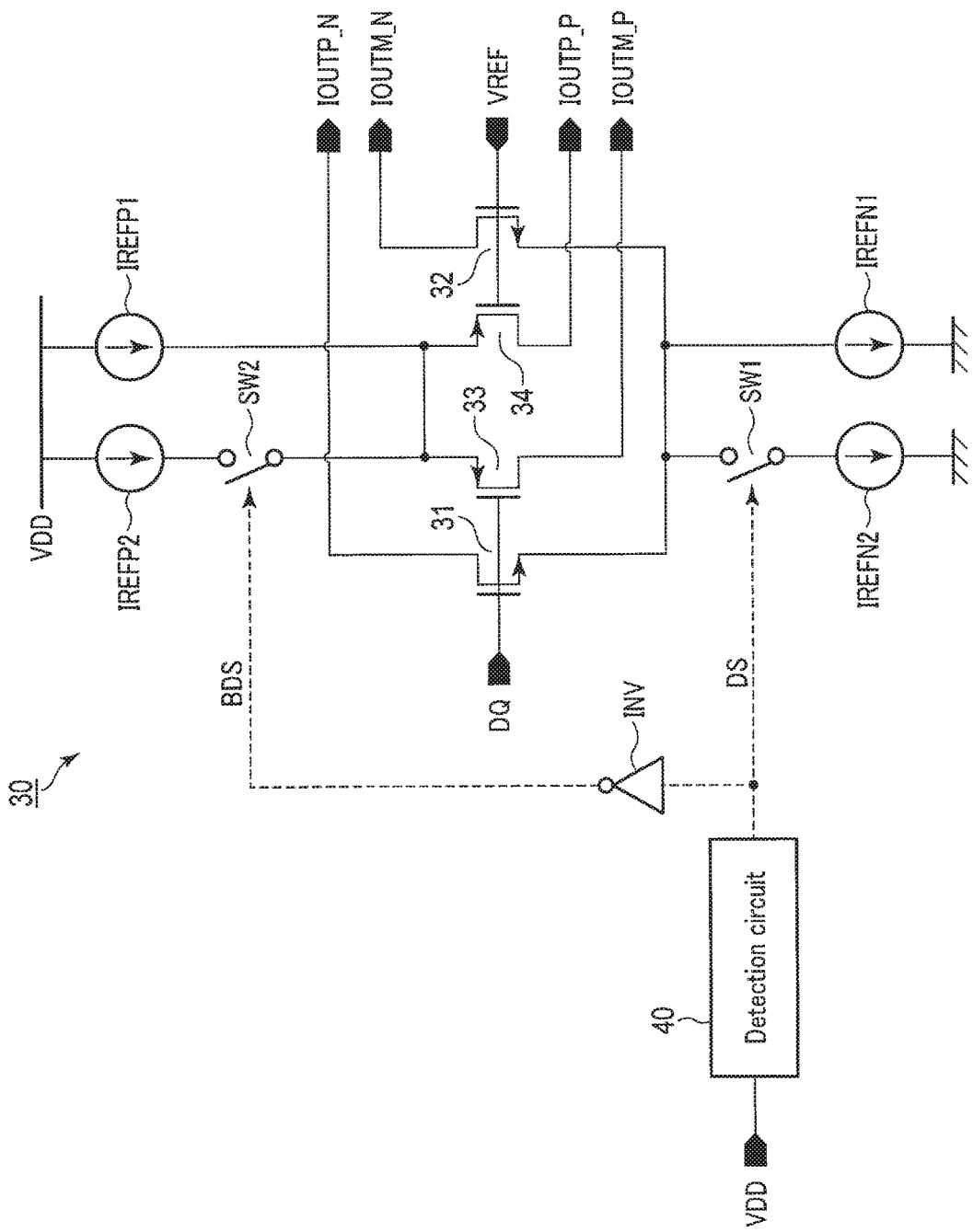
F I G. 14

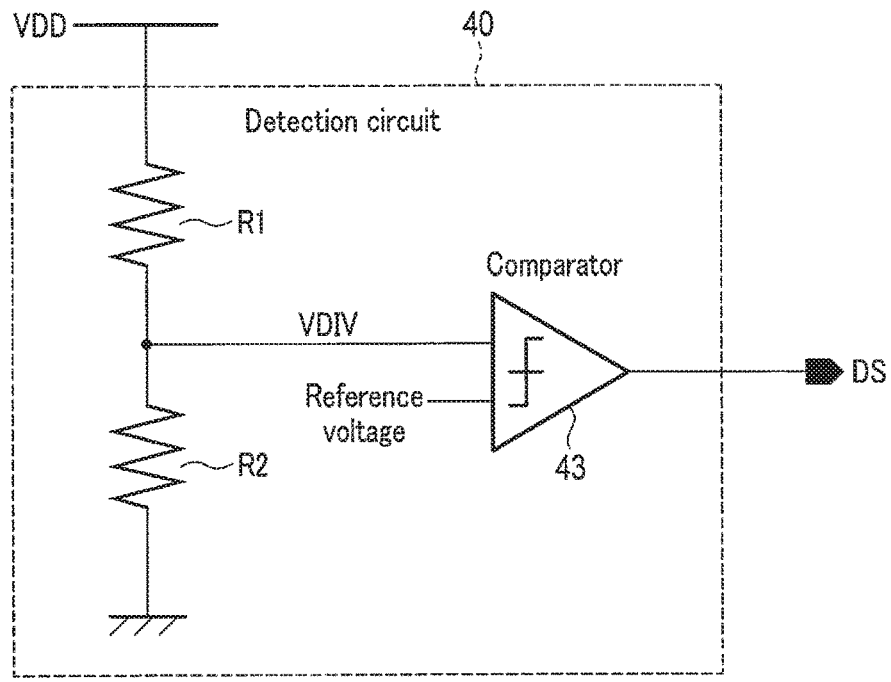
F I G. 15
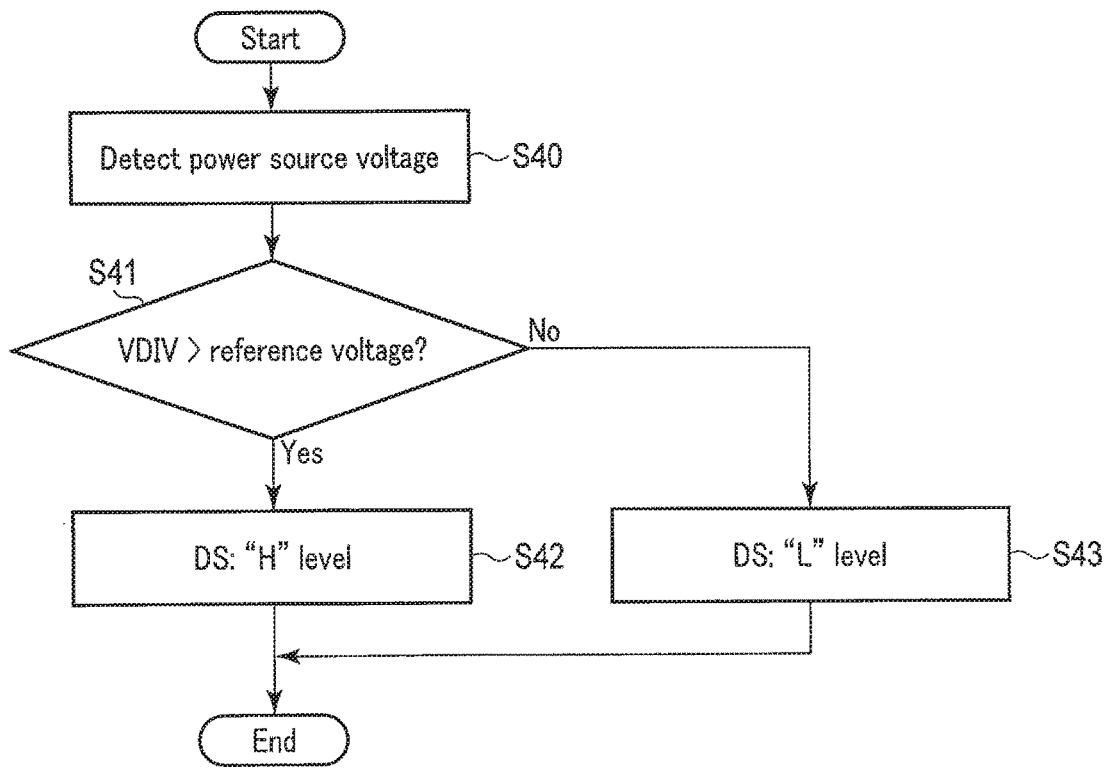
F I G. 16

AMPLIFIER CIRCUIT

CROSS-REFERENCE TO RELATED APPLICATIONS

This application is based upon and claims the benefit of priority from Japanese Patent Application No. 2017-039242, filed Mar. 2, 2017, the entire contents of which are incorporated herein by reference.

FIELD

Embodiments described herein relate generally to an amplifier circuit.

BACKGROUND

Amplifier circuits for use in external input signal receiving circuits (input receivers) and others on semiconductor integrated circuits are known.

BRIEF DESCRIPTION OF THE DRAWINGS

FIG. 1 is a block diagram showing a configuration example of a semiconductor integrated circuit.

FIG. 3 is a circuit diagram showing a configuration example of an amplifier circuit according to a first embodiment.

FIG. 5 is a circuit diagram showing a configuration example of a detection circuit included in the amplifier circuit according to the first embodiment.

FIG. 8 is a circuit diagram showing a configuration example of an amplifier circuit according to a second embodiment.

FIG. 9 is a circuit diagram showing a configuration example of a detection circuit included in the amplifier circuit according to the second embodiment.

FIG. 11 is a circuit diagram showing a configuration example of an amplifier circuit according to a third embodiment.

FIG. 14 is a circuit diagram showing a configuration example of an amplifier circuit according to a fourth embodiment.

FIG. 15 is a circuit diagram showing a configuration example of a detection circuit included in the amplifier circuit according to the fourth embodiment.

FIG. 16 is a flowchart of operations in the amplifier circuit according to the fourth embodiment.

DETAILED DESCRIPTION

Figure 2:
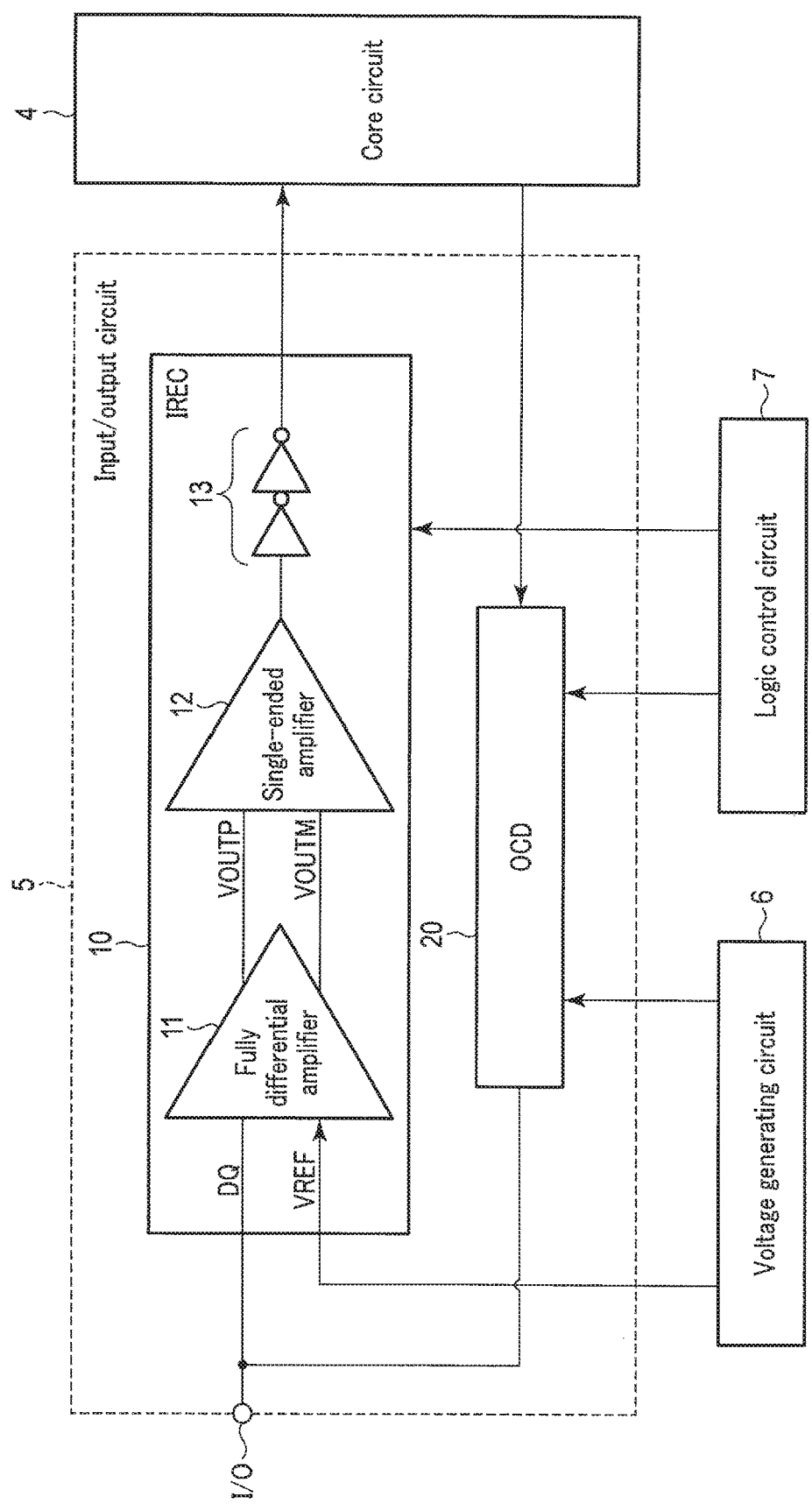
FIG. 2 is a block diagram showing a configuration example of the semiconductor integrated circuit.

In general, according to one embodiment, an amplifier circuit includes first and second differential amplifier circuits. The first differential amplifier circuit includes a first transistor having a gate to which a first signal is input, a second transistor having a gate to which a second signal is input, a first electric current source which supplies an electric current to one end of the first and second transistors, and a second electric current source which supplies an electric current to one end of the first and second transistors via a first switch element. The second differential amplifier circuit includes a third transistor having a gate to which the first signal is input, a fourth transistor having a gate to which the second signal is input, a second electric current source which supplies an electric current to one end of the third and fourth transistors, and a second electric current source which supplies an electric current to one end of the third and fourth transistors via a second switch element. The first switch element is controlled by a third signal. The second switch element is controlled by a fourth signal. The third signal and the fourth signal are in a complementary relationship.

Hereinafter, embodiments will be described with reference to the drawings. The drawings are schematic. In the following explanation, configurational components having substantially the same functions and configurations are attached with the same reference signs. Numbers after characters constituting the reference signs, and characters after numbers constituting the reference signs are referred to by the reference signs including the same characters or numbers, and are used to mutually differentiate elements having similar configurations. When it is not necessary to mutually differentiate elements indicated by the reference signs including the same characters, these elements are referred to by the reference signs including the same characters alone.

[1] First Embodiment

An amplifier circuit according to the first embodiment is used in, for example, a semiconductor integrated circuit comprising a semiconductor storage device. The amplifier circuit according to the first embodiment will be described below.

[1-1] Configuration

[1-1-1] Configuration of Semiconductor Integrated Circuit 1

A configuration example of the semiconductor integrated circuit 1 will be described with reference to FIG. 1. FIG. 1 is a block diagram showing a configuration example of the semiconductor integrated circuit 1. As shown in FIG. 1, the semiconductor integrated circuit 1 includes a controller 2 and a semiconductor storage device 3.

The controller 2 controls the semiconductor storage device 3 in response to an instruction from an external host device. For example, the controller 2 gives commands of reading, writing, erasing, and others to the semiconductor storage device 3.

The semiconductor storage device 3 is, for example, a NAND type flash memory 3 to store data in a non-volatile manner. As shown in FIG. 1, the semiconductor storage device 3 includes a core circuit 4, an input/output circuit 5, a logic control circuit 6, and a voltage generating circuit 7.

The core circuit 4 includes a memory cell array in which memory cells to store data in a non-volatile manner are arrayed. The core circuit 4 also includes peripheral circuits to control the memory cell array, such as a row decoder, a sense amplifier module, and a sequencer.

The input/output circuit 5 sends and receives, to and from the controller 2, for example, an 8-bit-width input/output signal DQ[7:0], and data strobe signals DQS and BDQS. For example, the input/output circuit 5 transfers the received input/output signal DQ to the core circuit 4 under the control of the logic control circuit 6.

The logic control circuit 6 controls the input/output circuit 5 and others based on various control signals received from the controller 2. For example, the logic control circuit 6 can instruct the input/output circuit 5 to receive data, commands, addresses, and others from the controller 2, and output data to the controller 2.

The voltage generating circuit 7 generates a voltage necessary for the operation of the NAND type flash memory 3, and supplies the voltage to each circuit. For example, the voltage generating circuit 7 can generate a reference voltage VREF or the like used when the input/output circuit 5 amplifies the signal received from the controller 2. The reference voltage VREF is set to, for example, a voltage VCCQ/2 of the semiconductor integrated circuit 1. The voltage VCCQ is an external power source voltage that is supplied to the semiconductor integrated circuit 1.

Next, a more detailed configuration of the input/output circuit 5 is described with reference to FIG. 2. FIG. 2 is a block diagram showing a configuration example of the semiconductor storage device 3, and shows the more detailed configuration of the input/output circuit 5. The input/output circuit 5 shown in FIG. 2 shows the extraction of configurational components corresponding to one of input/output terminals I/O provided in the input/output circuit 5.

As shown in FIG. 2, the input/output circuit 5 comprises an input receiver (IREC) 10 and an off chip driver (OCD) 20. The IREC 10 and the OCD 20 are coupled in parallel to each other between the input/output terminal I/O of the input/output circuit 5 and the core circuit 4.

The IREC 10 is used as a two-input input buffer circuit, and amplifies the signal input from the controller 2 and then outputs the amplified signal to the core circuit 4. The IREC 10 includes, for example, a fully differential amplifier 11, a single-ended amplifier 12, and an inverter part 13.

The fully differential amplifier 11 amplifies a potential difference between the signal (e.g. the input/output signal DQ) input from the controller 2 and the reference voltage VREF input from the voltage generating circuit 7. Thus, the fully differential amplifier 11 outputs signals VOUTP and VOUTM corresponding to the input/output signal DQ and the reference voltage VREF, and then inputs the signals VOUTP and VOUTM to the single-ended amplifier 12. The single-ended amplifier 12 is a circuit which transforms the signals VOUTP and VOUTM input from the fully differential amplifier 11 into single-phase voltages and then outputs the single-phase voltages. The signals transformed into the single-phase voltages are output to the core circuit 4 via the inverter part 13. Although the number of inverters in the inverter part 13 is two in the case shown by way of example in FIG. 2, the number is not limited to this. The number of inverters constituting the inverter part 13 can be designed to be any number.

The OCD 20 is used as an output buffer circuit, and outputs, to the controller 2, the signal transferred from the core circuit 4. For example, the OCD 20 outputs, to the controller 2, the signal transferred from the core circuit 4, by adjusting output resistance.

The IREC 10 and the OCD 20 described above are provided, for example, in accordance with the number of the input/output terminals I/O. The logic control circuit 6 operates one of the IREC 10 and the OCD 20 at the time of input/output of signals. Specifically, the logic control circuit 6, for example, operates the IREC 10 at the time of the input of data, and operates the OCD 20 at the time of the output of data.

[1-1-2] Configuration of Fully Differential Amplifier 11

A configuration example of the fully differential amplifier 11 according to the first embodiment is described with reference to FIG. 3. FIG. 3 shows one example of a basic circuit configuration of the fully differential amplifier 11. In the example used in the case described below, a signal input to the input/output terminal I/O is the input/output signal DQ. As shown in FIG. 3, the fully differential amplifier 11 includes an input section 30, a detection circuit 40, a current mirror circuit 50, and a load circuit 60.

The input section 30 includes an N-channel input section and a P-channel input section, each of which is a differential amplifier circuit, and the signal DQ and the reference voltage VREF are input to the input section 30. The input section 30 then outputs signals IOUTP_N and IOUTM_N from the N-channel input section and outputs signals IOUTP_P and IOUTM_P from the P-channel input section based on the input/output signal DQ and the reference voltage VREF. The detection circuit 40 controls electric current amounts supplied to the N-channel input section and the P-channel input section of the input section 30, for example, based on the input signals and the power source voltage. Detailed circuit configurations of the input section 30 and the detection circuit 40 will be described later.

The current mirror circuit 50 mirrors, for example, the signals IOUTP_N and IOUTM_N from the N-channel input section, and then supplies the signals to the load circuit 60. The load circuit 60 generates the output signals VOUTP and VOUTM in response to the signals IOUTP_N and IOUTM_N mirrored by the current mirror circuit 50, and the signals IOUTP_P and IOUTM_P from the P-channel input section. Specifically, as shown in FIG. 3, the current mirror circuit 50 includes P-channel MOS transistors 51 to 54, and the load circuit 60 includes N-channel MOS transistors 61 and 62.

The signals IOUTP_N and IOUTM_N are input to one end of the transistors 51 and 52, respectively. A gate of the transistors 51 and 52 are coupled to one end of the transistors 51 and 52, respectively. The other end of the transistors 51 and 52 are coupled to a power supply line. Gates of the transistors 53 and 54 are respectively coupled to the gates of the transistors 51 and 52, one end of the transistors 53 and 54 are coupled to nodes ND1 and ND2, respectively. The other end of the transistors 53 and 54 are coupled to the power supply line. The signals IOUTP_P and IOUTM_P are input to one end of the transistors 61 and 62, respectively. A gate of the transistor 61 is coupled to one end of the transistor 61 and the node ND1, and a gate of the transistor 62 is coupled to one end of the transistor 62 and the node ND2. The other end of the transistors 61 and 62 are coupled to a ground line. Due to such circuit configurations, voltages of the nodes ND1 and ND2 are output to the single-ended amplifier 12 as the signals VOUTP and VOUTM, respectively. The circuit configurations of output sections (e.g. the current mirror circuit 50 and the load circuit 60) in the fully differential amplifier 11 are not limited to the above, and may be other circuit configurations.

Figure 4:
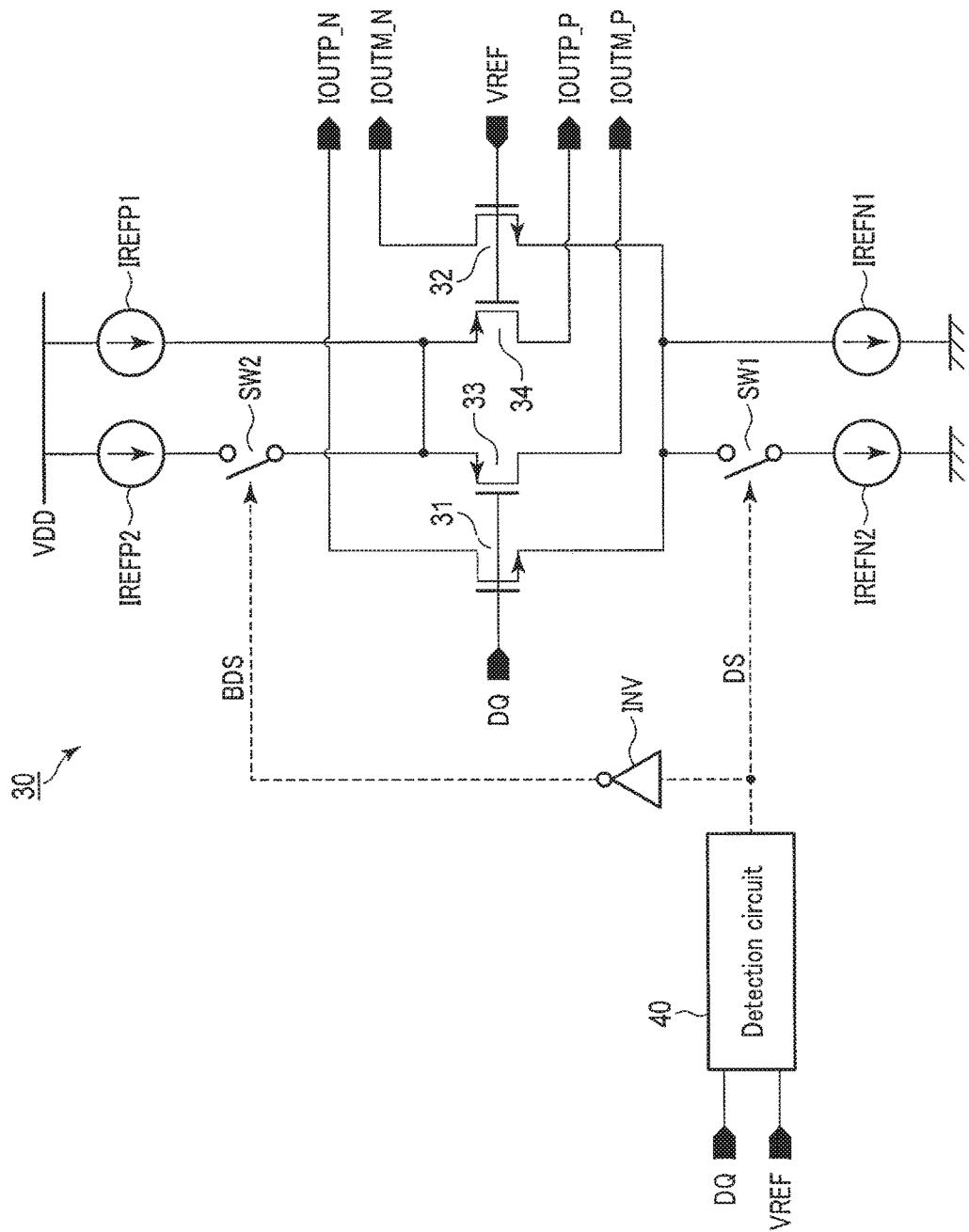
FIG. 4 is a circuit diagram showing a configuration example of an input section included in the amplifier circuit according to the first embodiment.

Next, a detailed configuration of the aforementioned input section 30 is described with reference to FIG. 4. A detailed circuit configuration in the input section 30 of the fully differential amplifier 11 is shown in FIG. 4. As shown in FIG. 4, the input section 30 of the fully differential amplifier 11 includes N-channel MOS transistors 31 and 32, P-channel MOS transistors 33 and 34, NMOS current source IREFN1 and IREFN2, PMOS current source IREFP1 and IREFP2, and switch elements SW1 and SW2.

The signal DQ is input to gates of the transistors 31 and 33, and the reference voltage VREF is input to gates of the transistors 32 and 34. One end of the transistors 31 and 32 are coupled to one end of the NMOS electric current source IREFN1, and the signals IOUTP_N and IOUTM_N are output from the other ends of the transistors 31 and 32, respectively. That is, the other end of the transistors 31 and 32 are coupled to one end of the transistors 51 and 52, respectively. One end of the transistors 31 and 32 are coupled to one end of the NMOS electric current source IREFN2 via the switch element SW1. The other end of the NMOS current source IREFN1 and IREFN2 are coupled to a ground line. One end of the transistors 33 and 34 are coupled to one end of the PMOS electric current source IREFP1, and the signals IOUTM_P and IOUTP_P are output from the other ends of the transistors 33 and 34, respectively. That is, the other ends of the transistors 33 and 34 are coupled to the nodes ND2 and ND1 shown in FIG. 3, respectively. One end of the transistors 33 and 34 are coupled to one end of the PMOS electric current source IREFP2 via the switch element SW2. The other end of the PMOS current source IREFP1 and IREFP2 are coupled to a power supply line.

Detection signals DS and BDS are input to the switch elements SW1 and SW2, respectively. The detection signal DS is a signal generated by the detection circuit 40 based on the signal DQ and the reference voltage VREF. The detection signal BDS is an inversion of the detection signal DS, and the detection signals DS and BDS have a complementary relationship. Moreover, the detection signal BDS is generated from the detection signal DS through an inverter, and, for example, one inverter INV is provided between a node from which the detection signal DS is output, and the switch element SW2. The number of inverters INV provided between the node from which the detection signal DS is output, and the switch elements SW2 is not limited to the above, and odd inverters have only to be provided. It can be considered that the detection signals DS and BDS have a complementary relationship in the first embodiment.

In the circuit configuration of the fully differential amplifier 11 described above, a set of transistors 31 and 32 corresponds to the N-channel input section (N-channel differential input pair), and a set of transistors 33 and 34 corresponds to the P-channel input section (P-channel differential input pair). The N-channel differential input pair and the P-channel differential input pair are differential amplifier circuits which receive input signals by the N-channel MOS transistors and the P-channel MOS transistors, respectively. A detailed circuit configuration of the detection circuit 40 which generates the detection signal DS to be input to the switch element SW1 is shown in FIG. 5. As shown in FIG. 5, the detection circuit 40 includes an adder 41, a smoothing circuit 42, and a comparator 43.

The signal DQ and the reference voltage VREF are input to the adder 41. The adder 41 then adds the signal DQ and the reference voltage VREF to remove a differential component, and only extracts an in-phase component. A voltage of the in-phase component extracted from a differential signal input to the adder 41 is hereinafter referred to as an input common-mode voltage. The input common-mode voltage corresponds to, for example, a voltage value (VINP+VINM)/2 which is an average of a signal VINP input to the N-channel input section, and a signal VINM input to the P-channel input section. The adder 41 then inputs the extracted input common-mode voltage to the smoothing circuit 42.

The smoothing circuit 42 smoothes the input common-mode voltage input from the adder 41, and thereby removes a high-frequency component. The smoothing circuit 42 then inputs a direct-current component of the extracted input common-mode voltage to a first input node of the comparator 43.

The comparator 43 compares the input common-mode voltage input to the first input node with a reference voltage input to a second input node, and then outputs a comparison result (the detection signal DS) to the input section 30. The reference voltage input to the comparator 43 is, for example, a power source voltage VDD/2. The power source voltage VDD is an internal power source voltage of the semiconductor storage device 3. The voltage value of the reference voltage is not limited to the above, and can be set to any voltage value. The detection signal DS output by the comparator 43 is, for example, a signal amplified to the power source voltage VDD or a ground voltage VSS.

In the circuit configuration of the fully differential amplifier 11 described above with reference to FIG. 3 to FIG. 5, the voltage applied to the power supply line is, for example, the power source voltage VDD, and the voltage applied to the ground line is, for example, the ground voltage VSS. Although the connection relationship between one end and the other end of the electric current source and each configurational component has been described above, the connection relationship is not limited to the above. For example, the N-channel input section has only to be coupled to the ground line via the NMOS electric current source IREFN, and the P-channel input section has only to be coupled to the ground line via the PMOS electric current source IREFP.

[1-2] Operation of Fully Differential Amplifier 11

Figure 6:
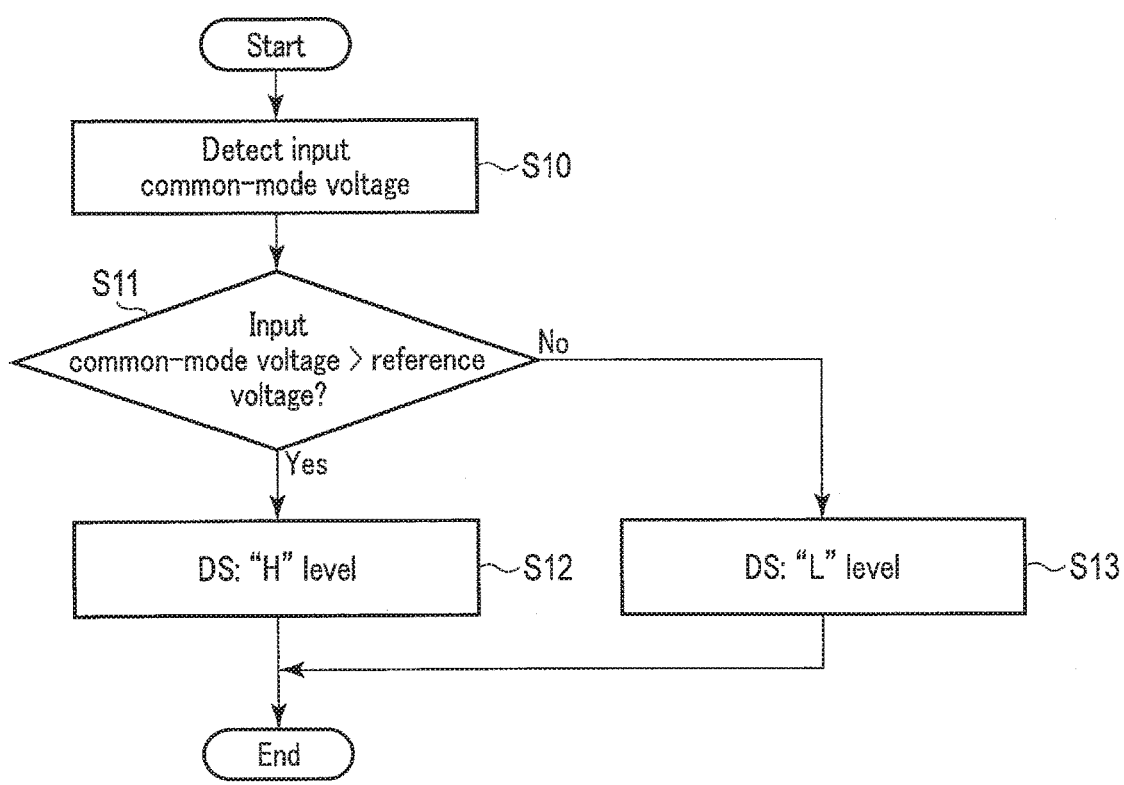
FIG. 6 is a flowchart of operations in the amplifier circuit according to the first embodiment.

An operation example of the fully differential amplifier 11 according to the first embodiment is described with reference to FIG. 6. FIG. 6 is a flowchart of the operation in the fully differential amplifier 11 according to the first embodiment, and shows an operation example of the fully differential amplifier 11 in the case where a signal is input to the input/output circuit 5 from the controller 2. The following explanation is based on the assumption that the switch element SW turns on when an "H" level signal is input, and the switch element SW turns off when an "L" level signal is input.

When the IREC 10 starts operation under the control of the logic control circuit 6, the detection circuit 40 first detects the input common-mode voltage as shown in FIG. 6 (step S10), and compares the input common-mode voltage with the reference voltage (step S11).

When the input common-mode voltage is higher than the reference voltage (step S11, Yes), the detection circuit 40 outputs the "H" level detection signal DS (step S12). Then the switch element SW1 of the input section 30 turns on, and an electric current path between the transistors 31 and 32 and the NMOS electric current source IREFN2 is formed. On the other hand, the detection signal BDS becomes the "L" level because the "H" level detection signal DS is inverted by the inverter INV. Then the switch element SW2 of the input section 30 turns off, and an electric current path between the transistors 33 and 34 and the PMOS electric current source IREFP2 is cut off. As a result, the electric current amount supplied to the N-channel input section becomes greater than the electric current amount supplied to the P-channel input section.

When the input common-mode voltage is less than or equal to the reference voltage (step S11, No), the detection circuit 40 outputs the "L" level detection signal DS (step S13). Then the switch element SW1 of the input section 30 turns off, and the electric current path between the transistors 31 and 32 and the NMOS electric current source IREFN2 is cut off. On the other hand, the detection signal BDS becomes the "H" level because the "L" level detection signal DS is inverted by the inverter INV. Then the switch element SW2 of the input section 30 turns on, and an electric current path between the transistors 33 and 34 and the PMOS electric current source IREFP2 is formed. As a result, the electric current amount supplied to the P-channel input section becomes greater than the electric current amount supplied to the N-channel input section.

As described above, the fully differential amplifier 11 according to the first embodiment changes the electric current amounts flowing to the N-channel input section and the P-channel input section in two steps based on the magnitude of the input common-mode voltage. Moreover, in the fully differential amplifier 11, when one of the switch elements SW1 and SW2 is in an on-state, the other is in an off-state. That is, the switch elements SW1 and SW2 complementarily operate.

[1-3] Advantageous Effects of First Embodiment

The fully differential amplifier 11 according to the first embodiment described above can inhibit the deterioration of a small signal gain and a signal band despite the fluctuation of the input common-mode voltage. Details of the present advantageous effects are described below.

The input signal receiving circuit (input receiver: IREC) used in the semiconductor integrated circuit is an interface circuit which amplifies an externally input signal. The IREC amplifies the input signal by the previous-stage fully differential amplifier, and downsamples the amplified signal by the subsequent-stage single-ended amplifier. Accordingly, the IREC can amplify the high-speed and small-amplitude input signal, and can supply a sufficiently amplified voltage to the outside. Due to this, the fully differential amplifier used in the IREC needs to provide high-speed response and a high gain over a wide range of the power source voltage because the power source voltage of the semiconductor integrated circuit may vary according to specifications, environment, and others.

Figure 7:
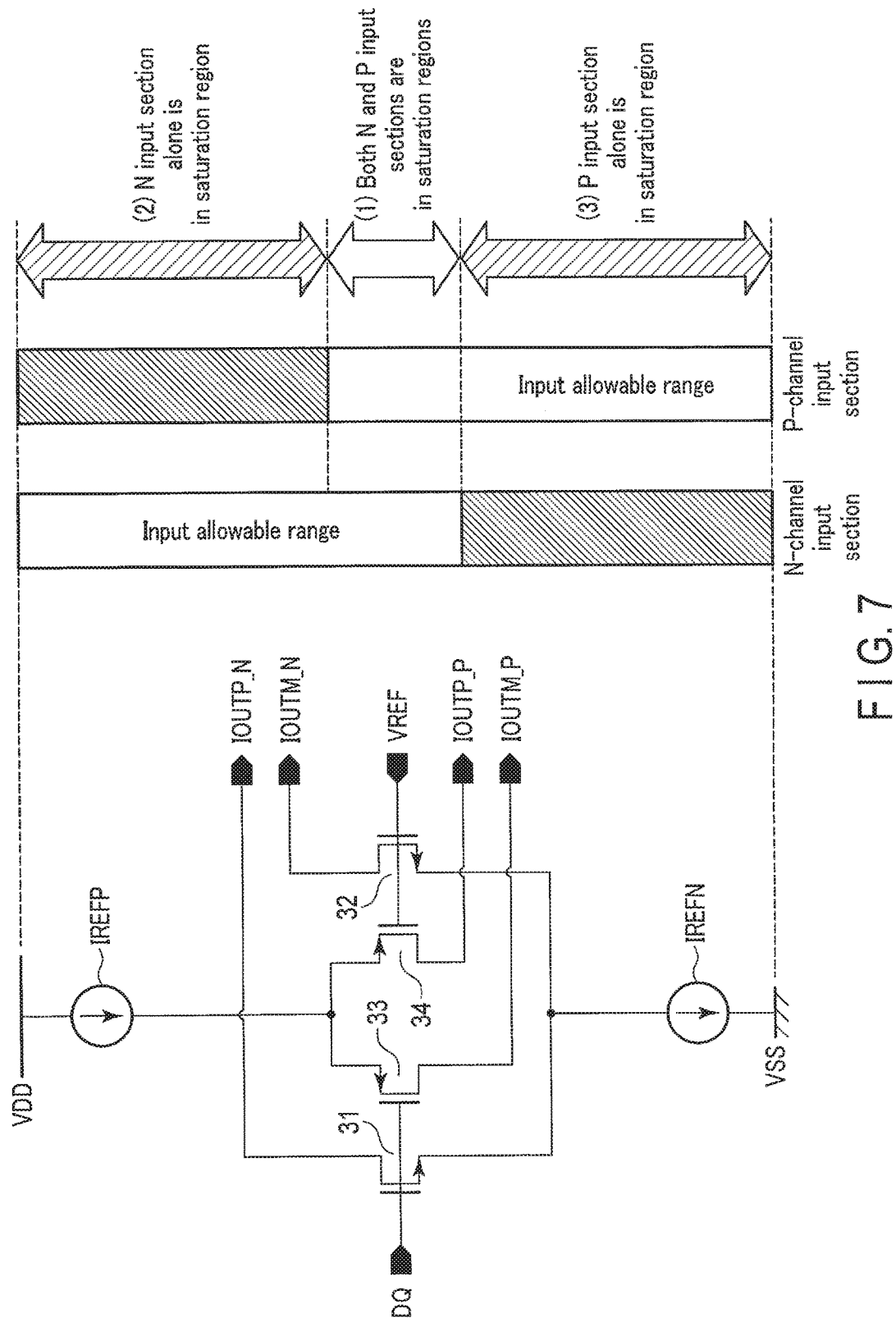
FIG. 7 is a circuit diagram showing a configuration example of an amplifier circuit according to a comparative example of the first embodiment.

Here, a fully differential amplifier according to a comparative example of the first embodiment is described with reference to FIG. 7. FIG. 7 shows a circuit diagram of the fully differential amplifier according to the comparative example of the first embodiment, and a schematic diagram of operation regions of the N-channel input section and the P-channel input section. The circuit configuration of the fully differential amplifier according to the comparative example shown in FIG. 7 is similar to the circuit configuration of the fully differential amplifier 11 described above with reference to FIG. 4, from which the switch elements SW1 and SW2 and the current source IREFN2 and IREFP2 are omitted.

As shown in FIG. 7, the fully differential amplifier according to the comparative example includes an N-channel input section (transistors 31 and 32) and a P-channel input section (transistors 33 and 34) to respond to input signals from a power source voltage and a ground voltage. A negative power source voltage (e.g. a ground voltage VSS) is supplied to an N-channel MOS transistor pair of the N-channel input section, and a positive power source voltage (e.g. a power source voltage VDD) is supplied to a P-channel MOS transistor pair of the P-channel input section. The fully differential amplifier can perform saturated operation between rails (i.e. between the power source voltage and the ground voltage) by combining the N-channel input section and the P-channel input section as above.

The fully differential amplifier which operates between the rails is broadly classified into three operation regions by a combination of a saturation region of the transistor in the N-channel input section and a saturation region of the transistor in the P-channel input section. Specifically, the fully differential amplifier is classified into three operation regions: a first operation region ((1) in FIG. 7) in which both the N-channel input section and the P-channel input section are in saturation regions, a second operation region ((2) in FIG. 7) in which the N-channel input section alone is in a saturation region, and a third operation region ((3) in FIG. 7) in which the P-channel input section alone is in a saturation region.

For example, when an input signal is included in the first operation region, both the N-channel input section and the P-channel input section operate, so that the fully differential amplifier can sufficiently amplify the input signal. On the other hand, when an input signal is included in the second or third operation region, the input signal is amplified in only one of the N-channel input section and the P-channel input section, so that the amplification factor of the fully differential amplifier is lower than in the first operation region. That is, the fully differential amplifier according to the comparative example changes the amplification factor according to the operation regions, and thus there is a possibility that the small signal gain and the signal band may deteriorate when the fully differential amplifier according to the comparative example is used at different power source voltages.

Accordingly, in the fully differential amplifier 11 according to the first embodiment, added to the fully differential amplifier including the N-channel input section and the P-channel input section are a detection circuit 40 which detects the input common-mode voltage and then compares the input common-mode voltage with the reference voltage, an NMOS electric current source IREFN2 coupled to the N-channel input section via the switch element SW1, and a PMOS electric current source IREFP2 coupled to the P-channel input section via the switch element SW2. The detection circuit 40 then controls the switch elements SW1 and SW2 based on the voltage value of the input common-mode voltage, and thereby changes the distribution of the electric current amounts to be supplied to the N-channel input section and the P-channel input section.

Specifically, for example, when the input common-mode voltage is much higher than the reference voltage and the N-channel input section alone operates in the saturation region, the detection circuit 40 turns on the switch element SW1, and then turns off the switch element SW2. Accordingly, the electric current to the N-channel input section is supplied by two current source (IREFN1 and IREFN2), and the electric current to the P-channel input section is supplied by one electric current source (IREFP1).

On the other hand, for example, when the input common-mode voltage is much lower than the reference voltage and the P-channel input section alone operates in the saturation region, the detection circuit 40 turns on the switch element SW2, and then turns off the switch element SW1. Accordingly, the electric current to the P-channel input section is supplied by two current source (IREFP1 and IREFP2), and the electric current to the N-channel input section is supplied by one electric current source (IREFN1).

The detection circuit 40 provided in the fully differential amplifier 11 according to the first embodiment controls the switch elements SW so that the electric current is supplied by two current source to one of the N-channel input section and the P-channel input section that maintains the gain and the signal band, and the detection circuit 40 controls the switch elements SW so that the electric current is supplied by one electric current source to the input section in which the gain and the signal band have deteriorated. That is, the fully differential amplifier 11 according to the first embodiment is configured so that the electric current amount to the input section that maintains the gain and the signal band is greater than the electric current amount to the input section in which the gain and the signal band have deteriorated.

Due to this, the fully differential amplifier 11 according to the first embodiment can complement, by the other input section, the gain and the signal band that have deteriorated in one of the input sections. Therefore, the fully differential amplifier 11 according to the first embodiment can inhibit the deterioration of the small signal gain and the signal band despite the fluctuation of the input common-mode voltage, and can therefore provide a high-speed response and a high gain over a wide range of the power source voltage. Furthermore, the IREC 10 using the fully differential amplifier 11 according to the first embodiment can sufficiently amplify a small-amplitude signal, and can therefore adapt to the high-speed operation of the semiconductor integrated circuit 1.

In the fully differential amplifier 11 according to the first embodiment, the switch elements SW1 and SW2 complementarily operate, so that the total of the electric current amounts to be supplied to the N-channel input section and the P-channel input section is substantially constant. Thus, the fully differential amplifier 11 according to the first embodiment can operate with constant electric power consumption, and the IREC 10 using the fully differential amplifier 11 according to the first embodiment can therefore improve stability of operation.

[2] Second Embodiment

Next, a fully differential amplifier 11 according to the second embodiment is described. The fully differential amplifier 11 according to the second embodiment is equivalent to the fully differential amplifier 11 described in the first embodiment to which an electric current source to be controlled by a detection circuit 40 is added.

[2-1] Configuration of Fully Differential Amplifier 11

A configuration example of the fully differential amplifier 11 according to the second embodiment is described with reference to FIG. 8. FIG. 8 shows one example of a circuit configuration in an input section 30 of the fully differential amplifier 11 according to the second embodiment. As shown in FIG. 8, the input section 30 of the fully differential amplifier 11 according to the second embodiment further includes an NMOS electric current source IREFN3, a PMOS electric current source IREFP3, and switch elements SW3 and SW4, in contrast to the input section 30 of the fully differential amplifier 11 described with reference to FIG. 4 in the first embodiment.

One end of transistors 31 and 32 are coupled to one end of the NMOS electric current source IREFN3 via the switch element SW3. The other end of the NMOS electric current source IREFN3 is coupled to a ground line. One end of transistors 33 and 34 are coupled to one end of the PMOS electric current source IREFP3 via the switch element SW4. The other end of the PMOS electric current source IREFP3 is coupled to a power supply line.

Detection signals DS1 and BDS1 are input to switch elements SW1 and SW2, respectively. Detection signals DS2 and BDS2 are input to the switch elements SW3 and SW4, respectively. The detection signals BDS1 and BDS2 are inversions of the detection signals DS1 and DS2, respectively. The detection signals DS1 and BDS1 have a complementary relation, and the detection signals DS2 and BDS2 have a complementary relation. The detection signals BDS1 and BDS2 are generated from the detection signals DS1 and DS2 through inverters, respectively. For example, an inverter INV1 is coupled between a node from which the detection signal DS1 is output, and the input of the switch element SW2, and an inverter INV2 is coupled between a node from which the detection signal DS2 is output, and the input of the switch element SW4. It is to be noted that the number of inverters INV respectively provided between the nodes from which the detection signals DS1 and DS2 are output, and the switch elements SW2 and SW4 is not limited to the above, and odd inverters INV have only to be provided.

Furthermore, a detailed circuit configuration of the detection circuit 40 which generates the detection signals DS1 and DS2 to be respectively input to the switch elements SW1 and SW3 is shown in FIG. 9. As shown in FIG. 9, the detection circuit 40 in the second embodiment is similar to the detection circuit 40 described with reference to FIG. 5 in the first embodiment in which two comparators 43 (43A and 43B) are coupled to the output of the smoothing circuit 42.

Specifically, an input common-mode voltage output by the smoothing circuit 42 is input to first input nodes of the comparators 43A and 43B. A first reference voltage, and a second reference voltage lower than the first reference voltage are input to second input nodes of the comparators 43A and 43B, respectively. Further, the comparator 43A compares the input common-mode voltage input to the first input node with the first reference voltage input to the second input node, and then outputs a comparison result (the detection signal DS1) to the input section 30. Similarly, the comparator 43B compares the input common-mode voltage input to the first input node with the second reference voltage input to the second input node, and then outputs a comparison result (the detection signal DS2) to the input section 30. The other configuration of the detection circuit 40 is similar to that of the detection circuit 40 described with reference to FIG. 5 in the first embodiment, and is therefore not described.

[2-2] Operation of Fully Differential Amplifier 11

Figure 10:
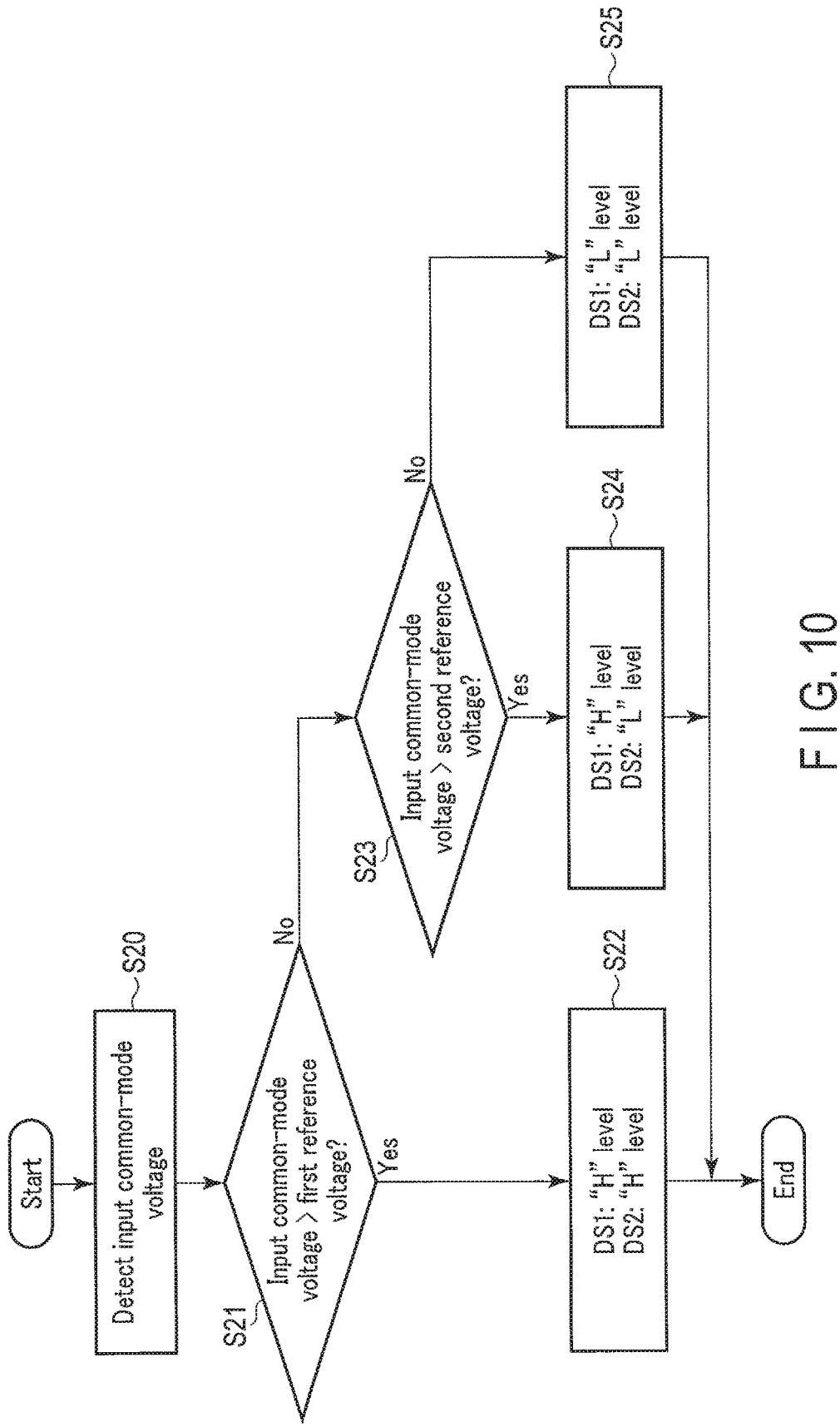
FIG. 10 is a flowchart of operations in the amplifier circuit according to the second embodiment.

An operation example of the fully differential amplifier 11 according to the second embodiment is described with reference to FIG. 10. FIG. 10 is a flowchart of operation in the fully differential amplifier 11 according to the second embodiment. FIG. 10 shows an operation example of the fully differential amplifier 11 in the case where a signal is input to the input/output circuit 5 from the controller 2.

When the IREC 10 starts operation under the control of the logic control circuit 6, the detection circuit 40 first detects the input common-mode voltage as shown in FIG. 10 (step S20), and compares the input common-mode voltage with the first reference voltage (step S21).

When the input common-mode voltage is higher than the first reference voltage (step S21, Yes), the detection circuit 40 outputs the "H" level detection signals DS1 and DS2 (step S22). Then the switch elements SW1 and SW3 of the input section 30 turn on, an electric current path between the transistors 31 and 32 and the NMOS electric current source IREFN2 is formed, and an electric current path between the transistors 31 and 32 and the NMOS electric current source IREFN3 is formed. On the other hand, the detection signals BDS1 and BDS2 become the "L" level because the "H" level detection signal DS is inverted by the inverter INV. Then the switch elements SW2 and SW4 of the input section 30 turn off, an electric current path between the transistors 33 and 34 and the PMOS electric current source IREFP2 is cut off, and an electric current path between the transistors 33 and 34 and the PMOS electric current source IREFP3 is cut off. As a result, the electric current amount supplied to the N-channel input section becomes greater than the electric current amount supplied to the P-channel input section.

When the input common-mode voltage is less than or equal to the first reference voltage (step S21, No) and is higher than the second reference voltage (step S23, Yes), the detection circuit 40 outputs the "H" level detection signal DS1 and the "L" level detection signal DS2 (step S24). Then the switch element SW1 of the input section 30 turns off, and the electric current path between the transistors 31 and 32 and the NMOS electric current source IREFN2 is formed, the switch element SW3 turns off, and the electric current path between the transistors 31 and 32 and the NMOS electric current source IREFN3 is cut off. On the other hand, the detection signals BDS1 and BDS2 respectively become the "L" level and the "H" level because the "H" level and "L" level detection signals DS are inverted by the inverters INV. Then the switch element SW2 of the input section 30 turns off, the electric current path between the transistors 33 and 34 and the PMOS electric current source IREFP2 is cut off, the switch element SW4 turns on, and the electric current path between the transistors 33 and 34 and the PMOS electric current source IREFP3 is formed. As a result, the electric current amount supplied to the N-channel input section and the electric current amount supplied to the P-channel input section become substantially equal to each other.

When the input common-mode voltage is less than or equal to the first reference voltage (step S21, No) and is less than or equal to the second reference voltage (step S23, No), the detection circuit 40 outputs the "L" level detection signals DS1 and DS2 (step S25). Then the switch elements SW1 and SW3 of the input section 30 turn off, the electric current path between the transistors 31 and 32 and the NMOS electric current source IREFN2 is cut off, and the electric current path between the transistors 31 and 32 and the NMOS electric current source IREFN3 is cut off. On the other hand, the detection signals BDS1 and BDS2 become the "H" level because the "L" level detection signals DS are inverted by the inverters INV1 and INV2. Then the switch elements SW2 and SW4 of the input section 30 turn on, the electric current path between the transistors 33 and 34 and the PMOS electric current source IREFP2 is formed, and the electric current path between the transistors 33 and 34 and the PMOS electric current source IREFP3 is formed. As a result, the electric current amount supplied to the P-channel input section becomes greater than the electric current amount supplied to the N-channel input section.

As described above, the fully differential amplifier 11 according to the second embodiment changes the electric current amounts flowing to the N-channel input section and the P-channel input section at three steps based on the magnitude of the input common-mode voltage. Moreover, in the fully differential amplifier 11, when one of the switch elements SW1 and SW2 is in an on-state, the other is in an off-state. Similarly, when one of the switch elements SW3 and SW4 is in an on-state, the other is in an off-state. That is, the switch elements SW1 and SW2 complementarily operate, and the switch elements SW3 and SW4 complementarily operate.

[2-3] Advantageous Effects of Second Embodiment

The fully differential amplifier 11 according to the second embodiment described above includes three current source connectable to the N-channel input section and three current source connectable to the P-channel input section. The detection circuit 40 then controls two of the three current source to each input section based on the two reference voltages.

Specifically, for example, when the input common-mode voltage is higher than the first reference voltage and the N-channel input section alone operates in the saturation region, the detection circuit 40 turns on the switch elements SW1 and SW3, and then turns off the switch elements SW2 and SW4. Accordingly, the electric current to the N-channel input section is supplied by three current source (IREFN1 to IREFN3), and the electric current to the P-channel input section is supplied by one electric current source (IREFP1).

When the input common-mode voltage is between the first reference voltage and the second reference voltage and, for example, the N-channel input section and the P-channel input section alone operate in the saturation regions, the detection circuit 40 turns on the switch elements SW1 and SW4, and then turns off the switch elements SW2 and SW3. Accordingly, the electric current to the N-channel input section is supplied by two current source (IREFN1 and IREFN2), and the electric current to the P-channel input section is supplied by two current source (IREFP1 and IREFP3).

Furthermore, when the input common-mode voltage is lower than the second reference voltage and, for example, the P-channel input section alone operates in the saturation region, the detection circuit 40 turns on the switch elements SW2 and SW4, and then turns off the switch elements SW1 and SW3. Accordingly, the electric current to the N-channel input section is supplied by one electric current source (IREFN1), and the electric current to the P-channel input section is supplied by three current source (IREFP1 to IREFP3).

That is, the detection circuit 40 provided in the fully differential amplifier 11 according to the second embodiment can increase the electric current amount supplied to the N-channel input section when the gain and the signal band of the P-channel input section have deteriorated, the detection circuit 40 can supply the same amount of electric current to the N-channel input section and the P-channel input section when the N-channel input section and the P-channel input section operate in the saturation regions, and the detection circuit 40 can increase the electric current amount supplied to the P-channel input section when the gain and the signal band of the N-channel input section have deteriorated.

Thus, the fully differential amplifier 11 according to the second embodiment can more finely adjust the electric current amounts supplied to the N-channel input section and the P-channel input section than in the first embodiment, and can further equalize the gain and the signal band in each operation region than in the first embodiment. Consequently, the fully differential amplifier 11 according to the second embodiment can provide high-speed response and a high gain over a wide range of the power source voltage as in the first embodiment, and can more stably operate than in the first embodiment. Furthermore, the IREC 10 using the fully differential amplifier 11 according to the second embodiment can more adapt to the high-speed operation of the semiconductor integrated circuit 1 than in the first embodiment.

It is to be noted that in the fully differential amplifier 11 according to the second embodiment, the switch elements SW1 and SW2 complementarily operate, and the switch elements SW3 and SW4 complementarily operate, so that the total of the electric current amounts to be supplied to the N-channel input section and the P-channel input section is substantially constant. Thus, the fully differential amplifier 11 according to the second embodiment can operate with constant electric power consumption, and the IREC 10 using the fully differential amplifier 11 according to the second embodiment can therefore improve stability of operation as in the first embodiment.

[3] Third Embodiment

Next, a fully differential amplifier 11 according to the third embodiment is described. The fully differential amplifier 11 according to the third embodiment is configured so that the detection circuit 40 controls, for example, in a stepless manner, the electric current supply amount in the electric current source coupled to the N-channel input section and the electric current supply amount in the electric current source coupled to the P-channel input section.

[3-1] Configuration of Fully Differential Amplifier 11

A configuration example of the fully differential amplifier 11 according to the third embodiment is described with reference to FIG. 11. FIG. 11 shows one example of a circuit configuration of the fully differential amplifier 11 according to the third embodiment. As shown in FIG. 11, the input section 30 of the fully differential amplifier 11 according to the third embodiment is similar to the input section 30 of the fully differential amplifier 11 according to the comparative example described with reference to FIG. 7 in the first embodiment. The fully differential amplifier 11 according to the third embodiment is different from those in the first and second embodiments in that the detection circuit 40 can steplessly control the electric current supply amounts of the NMOS electric current source IREFN and the PMOS electric current source IREFP. A detailed circuit configuration of this detection circuit 40 is shown in FIG. 12.

Figure 12:
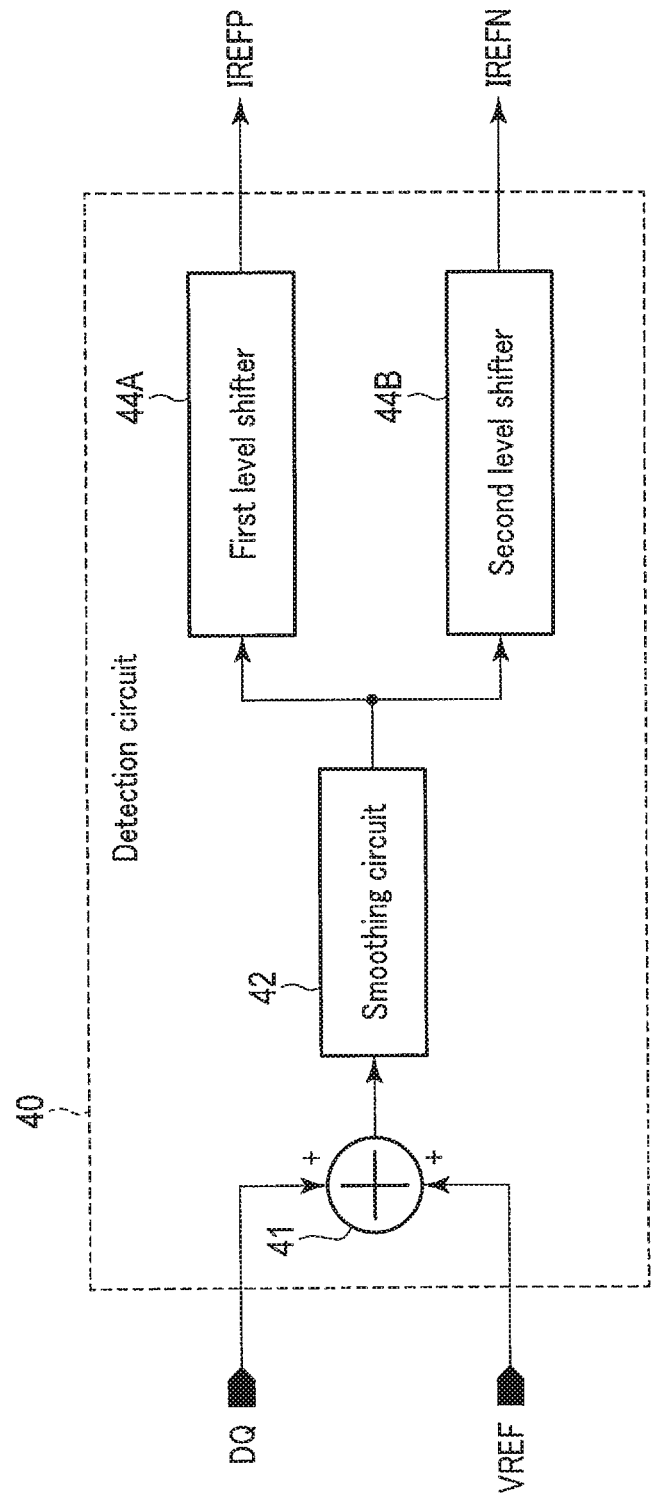
FIG. 12 is a circuit diagram showing a configuration example of a detection circuit included in the amplifier circuit according to the third embodiment.

As shown in FIG. 12, the detection circuit 40 according to the third embodiment is similar to the detection circuit 40 described with reference to FIG. 5 in the first embodiment in which two comparators 43 are replaced with a first level shifter 44A and a second level shifter 44B.

Specifically, an input common-mode voltage output by the smoothing circuit 42 is input to the first level shifter 44A and the second level shifter 44B. The level shifters 44 shift the output voltage based on the voltage value of the input common-mode voltage that has been input, and a preset reference voltage. The amounts in which the level shifters 44 shift the output voltage may be the same or different in the first level shifter 44A and the second level shifter 44B. Further, the first level shifter supplies a voltage based on the input common-mode voltage to the PMOS electric current source IREFP, and the second level shifter supplies a voltage based on the input common-mode voltage to the NMOS electric current source IREFN. The other configuration of the detection circuit 40 is similar to that of the detection circuit 40 described with reference to FIG. 5 in the first embodiment, and is therefore not described.

[3-2] Operation of Fully Differential Amplifier 11

Figure 13:
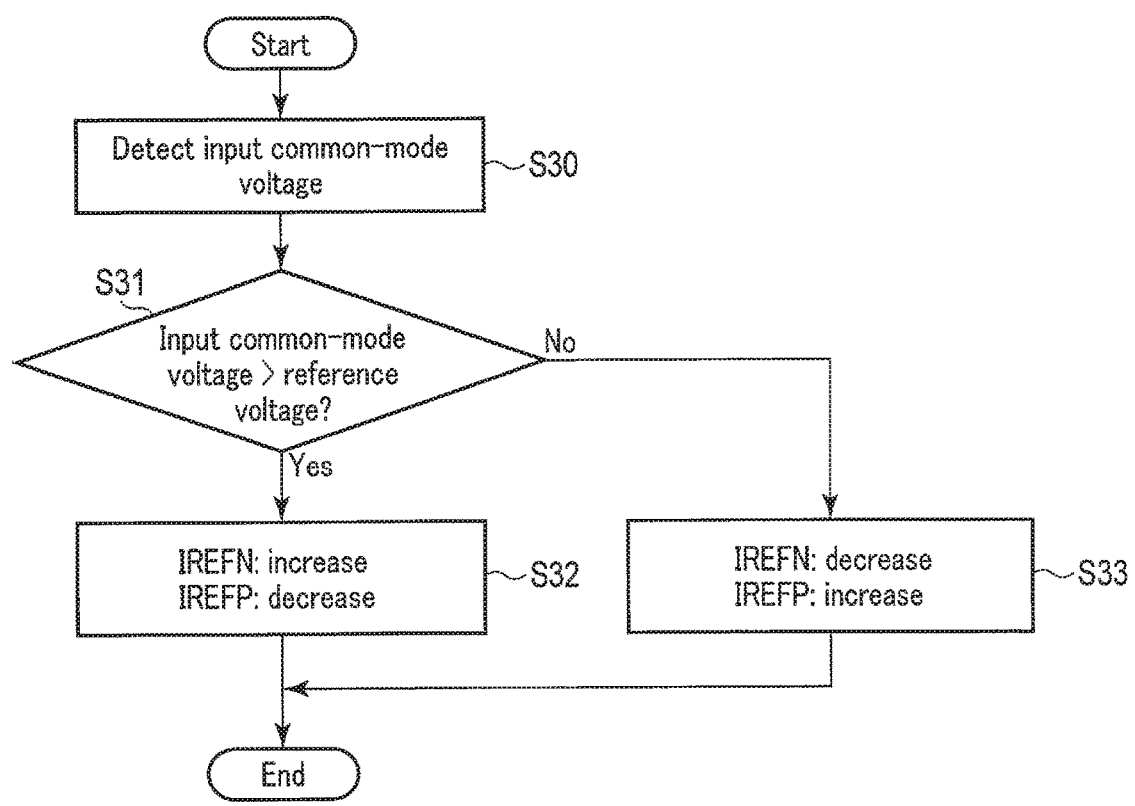
FIG. 13 is a flowchart of operations in the amplifier circuit according to the third embodiment.

An operation example of the fully differential amplifier 11 according to the third embodiment is described with reference to FIG. 13. FIG. 13 is a flowchart of operation in the fully differential amplifier 11 according to the third embodiment. FIG. 13 shows an operation example of the fully differential amplifier 11 in the case where a signal is input to the input/output circuit 5 from the controller 2.

When the IREC 10 starts operation under the control of the logic control circuit 6, the detection circuit 40 first detects the input common-mode voltage as shown in FIG. 13 (step S30), and compares the input common-mode voltage with the reference voltage (step S31).

When the input common-mode voltage is higher than the reference voltage (step S31, Yes), the detection circuit 40 controls to increase the electric current amount of the electric current source IREFN, and controls to decrease the electric current amount of the electric current source IREFP (step S32). As a result, the electric current amount supplied to the N-channel input section becomes greater than the electric current amount supplied to the P-channel input section.

When the input common-mode voltage is less than or equal to the reference voltage (step S31, No), the detection circuit 40 controls to decrease the electric current amount of the electric current source IREFN, and controls to increase the electric current amount of the electric current source IREFP (step S32). As a result, the electric current amount supplied to the P-channel input section becomes greater than the electric current amount supplied to the N-channel input section.

As described above, the fully differential amplifier 11 according to the third embodiment changes the electric current amounts flowing to the N-channel input section and the P-channel input section based on the magnitude of the input common-mode voltage. Specifically, the detection circuit 40 changes the output voltages of the level shifters 44A and 44B based on the potential difference between the input common-mode voltage and the reference voltage, and thereby controls the electric current amounts to be supplied to the respective input sections by the NMOS electric current source IREFN and the PMOS electric current source IREFP.

Although the electric current amount of the electric current source IREFP decreases and the electric current amount of the electric current source IREFN increases when the input common-mode voltage is less than or equal to the reference voltage in the case described above by way of example, it is not limited to this. For example, the detection circuit 40 may control the current source IREFN and IREFP so that the electric current amounts to be supplied to the N-channel input section and the P-channel input section are substantially the same when the input common-mode voltage is substantially the same as the reference voltage.

[3-3] Advantageous Effects of Third Embodiment

As described above, the fully differential amplifier 11 according to the third embodiment has one electric current source provided in each of the N-channel and P-channel input sections. The detection circuit 40 then directly controls the electric current amount to be supplied to each input section by the electric current source.

Specifically, the first level shifter 44A and the second level shifter 44B in the detection circuit 40 generate control signals to the current source IREFN and IREFP based on the input common-mode voltage, respectively. The current source IREFN and IREFP then change the electric current distribution to the N-channel input section and the P-channel input section based on the control signals generated by the level shifters 44. Also, the detection circuit 40 can change the increase amount and decrease amount of the electric current to be supplied to the N-channel input section and the electric current to be supplied to the P-channel input section, based on the potential difference between the input common-mode voltage and the reference voltage.

The fully differential amplifier 11 according to the third embodiment can change the electric current distribution to the N-channel input section and the P-channel input section in accordance with the operation regions of the fully differential amplifier 11, as in the first and second embodiments. Additionally, the fully differential amplifier 11 according to the third embodiment can more finely adjust the electric current amounts supplied to the N-channel input section and the P-channel input section than in the second embodiment.

Therefore, the fully differential amplifier 11 according to the third embodiment can more finely adjust the electric current amounts supplied to the N-channel input section and the P-channel input section than in the second embodiment. Additionally, the fully differential amplifier 11 according to the third embodiment can further equalize the gain and the signal band in each operation region than in the second embodiment. Consequently, the fully differential amplifier 11 according to the third embodiment can provide a high-speed response and a high gain over a wide range of the power source voltage as in the second embodiment, and can more stably operate than in the second embodiment. Furthermore, the IREC 10 using the fully differential amplifier 11 according to the third embodiment can adapt to the high-speed operation of the semiconductor integrated circuit 1 more so than in the second embodiment.

In the operation of the fully differential amplifier 11, the detection circuit 40 may control the current source IREFN and IREFP so that the total of the electric current amount to be supplied to the N-channel input section and the electric current amount to be supplied to the P-channel input section is substantially the same, or increases or decreases. For example, when the total of the electric current amounts to be supplied to the N-channel input section and the P-channel input section is substantially constant, the fully differential amplifier 11 can operate with constant electric power consumption as in the first and second embodiments. Therefore, the IREC 10 using the fully differential amplifier 11 according to the third embodiment can improve stability of operation as in the first and second embodiments.

Although the detection circuit 40 uses a pair of current source to adjust the electric current amounts to be supplied to the N-channel input section and the P-channel input section in the case described by way of example in the third embodiment, this is not a limitation. For example, in the fully differential amplifier 11, the current source IREFN and IREFP may be controlled by the detection circuit 40, or the electric current source that is controlled by the detection circuit 40 may be combined with the electric current source that is not controlled by the detection circuit 40.

[4] Fourth Embodiment

Next, a fully differential amplifier 11 according to the fourth embodiment is described. In the fourth embodiment, the detection circuit 40 outputs the detection signal DS based on the power source voltage VDD in the fully differential amplifier 11 according to the first embodiment.

[4-1] Configuration of Fully Differential Amplifier 11

A configuration example of the fully differential amplifier 11 according to the fourth embodiment is described with reference to FIG. 14. FIG. 14 shows one example of a circuit configuration of the fully differential amplifier 11 according to the fourth embodiment. As shown in FIG. 14, the fully differential amplifier 11 according to the fourth embodiment is different from the fully differential amplifier 11 described with reference to FIG. 4 in the first embodiment in that the detection circuit 40 outputs the detection signal DS based on the power source voltage VDD. A detailed circuit configuration of this detection circuit 40 is shown in FIG. 15.

As shown in FIG. 15, the detection circuit 40 includes resistors R1 and R2, and the comparator 43. The resistors R1 and R2 are coupled in series between a power supply line and a ground line. A node between the resistors R1 and R2 is coupled to the first input node of the comparator 43. A voltage VDIV divided from the power source voltage VDD is input to the first input node of the comparator 43. The reference voltage is input to the second input node of the comparator 43, and a comparison result (the detection signal DS) of the first and second input nodes is output. Thus, the detection circuit 40 according to the fourth embodiment includes a resistance voltage dividing circuit which divides the power source voltage VDD, and the comparator 43 which compares the divided voltage with the reference voltage and then outputs a comparison result.

[4-2] Operation of Fully Differential Amplifier 11

An operation example of the fully differential amplifier 11 according to the fourth embodiment is described with reference to FIG. 16. FIG. 16 is a flowchart of operation in the fully differential amplifier 11 according to the fourth embodiment. FIG. 16 shows an operation example of the fully differential amplifier 11 in the case where a signal is input to the input/output circuit 5 from the controller 2.

When the IREC 10 starts operation under the control of the logic control circuit 6, the detection circuit 40 first detects the input common-mode voltage as shown in FIG. 16 (step S40), and compares the voltage VDIV divided from the power source voltage VDD with the reference voltage (step S41).

When the voltage VDIV is higher than the reference voltage (step S41, Yes), the detection circuit 40 outputs the "H" level detection signal DS (step S42). When the voltage VDIV is less than or equal to the reference voltage (step S41, No), the detection circuit 40 outputs the "L" level detection signal DS (step S43). Detailed operations in steps S42 and S43 are similar to the operations in steps S12 and S13 described with reference to FIG. 6 in the first embodiment, respectively, and are therefore not described.

[4-3] Advantageous Effects of Fourth Embodiment

The fully differential amplifier 11 according to the fourth embodiment described above can inhibit the deterioration of a small signal gain and a signal band despite the fluctuation of the input common-mode voltage, as in the first embodiment. Details of the present advantageous effects are described below.

In the fully differential amplifier 11, the input common-mode voltage may become a voltage dependent on the power source voltage VDD in some cases. For example, the input common-mode voltage may become a voltage that is half the power source voltage VDD.

In the fully differential amplifier 11 according to the fourth embodiment, the detection circuit 40 detects the power source voltage VDD instead of detecting the input common-mode voltage. Specifically, the detection circuit 40 according to the fourth embodiment divides the power source voltage VDD by the resistors R1 and R2 and then inputs the divided voltage to the comparator 43, and compares the divided voltage with the reference voltage. The comparison result of the comparator 43 is then used as the detection signal DS similar to that in the first embodiment. That is, the detection circuit 40 controls the current source IREFN and IREFP based on the comparison result of the divided power source voltage VDD and the reference voltage.

Due to this, the fully differential amplifier 11 according to the fourth embodiment can change the electric current distribution to the N-channel input section and the P-channel input section in accordance with the operation regions of the fully differential amplifier 11, as in the first embodiment. Therefore, as in the first embodiment, the fully differential amplifier 11 according to the fourth embodiment can inhibit the deterioration of the small signal gain and the signal band despite the fluctuation of the input common-mode voltage, and can therefore provide high-speed response and a high gain over a wide range of the power source voltage. Furthermore, the IREC 10 using the fully differential amplifier 11 according to the fourth embodiment can adapt to the high-speed-operation of the semiconductor integrated circuit 1 as in the first embodiment.

The detection circuit 40 according to the fourth embodiment comprises the resistors R1 and R2 which divide the power source voltage VDD, and the comparator 43, and can thus be obtained with a simpler circuit than the detection circuit 40 according to the first embodiment. Therefore, the fully differential amplifier 11 according to the fourth embodiment can provide an amplifier circuit compatible with a wide range of input common-mode voltages at a lower cost than that in the first embodiment.

[5] Fifth Embodiment

Next, a fully differential amplifier 11 according to the fifth embodiment is described. In the fifth embodiment, the fully differential amplifier 11 is equivalent to the fully differential amplifier 11 according to the first embodiment in which the detection circuit 40 outputs the detection signal DS based on an external power source voltage VCCQ.

[5-1] Configuration of Fully Differential Amplifier 11

Figure 17:
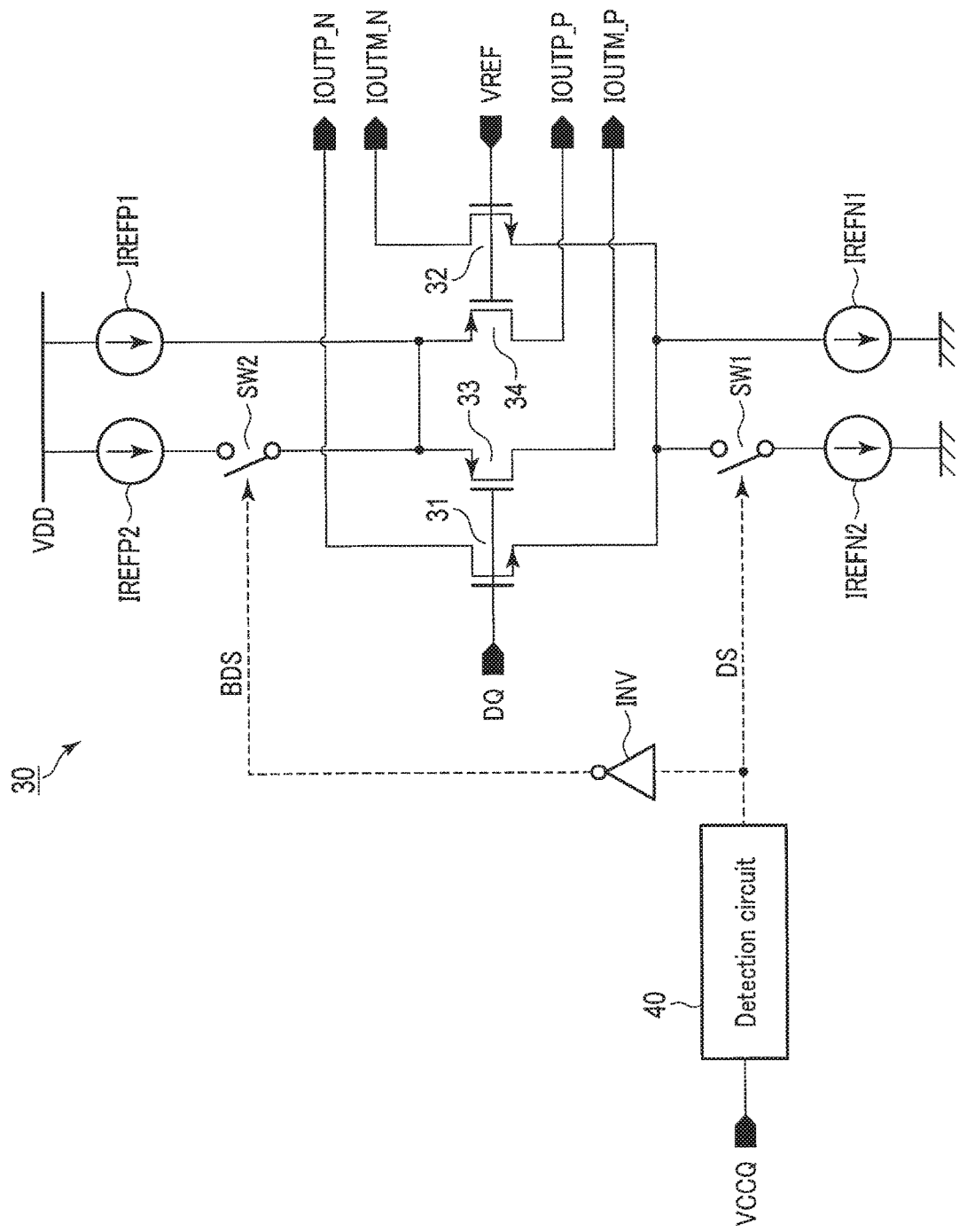
FIG. 17 is a circuit diagram showing a configuration example of an amplifier circuit according to a fifth embodiment.

The fully differential amplifier 11 according to the fifth embodiment is described with reference to FIG. 17. FIG. 17 shows one example of a circuit configuration of the fully differential amplifier 11 according to the fifth embodiment. As shown in FIG. 17, the fully differential amplifier 11 according to the fifth embodiment is different from the fully differential amplifier 11 described with reference to FIG. 15 in the fourth embodiment in that the detection circuit 40 outputs the detection signal DS based on the external power source voltage VCCQ. A circuit configuration of the detection circuit 40 according to the fifth embodiment is similar to the circuit configuration of the detection circuit 40 according to the fourth embodiment, and is only different in that the input voltage is changed from the power source voltage VDD to the external power source voltage VCCQ. The other circuit configuration of the fully differential amplifier 11 is similar to that of the fully differential amplifier 11 described with reference to FIG. 15 in the fourth embodiment, and is therefore not described.

[5-2] Advantageous Effects of Fifth Embodiment

The fully differential amplifier 11 according to the fifth embodiment described above can inhibit the deterioration of a small signal gain and a signal band despite the fluctuation of the input common-mode voltage, as in the first and fourth embodiments. Details of the present advantageous effects are described below.

Although the input common-mode voltage is the voltage dependent on the power source voltage VDD in the case described in the fourth embodiment, the power source voltage VDD of the input section of the fully differential amplifier 11 may be different from the external power source voltage VCCQ that is supplied from the outside, depending on how the fully differential amplifier 11 is mounted. In such a case, the input common-mode voltage may become a voltage dependent on the external power source voltage VCCQ.

In the fully differential amplifier 11 according to the fifth embodiment, the detection circuit 40 detects the external power source voltage VDD instead of detecting the input common-mode voltage or the power source voltage VDD. Specifically, the detection circuit 40 according to the fifth embodiment divides the power source voltage VCCQ by the resistors R1 and R2 and then inputs the divided voltage to the comparator 43, and compares the divided voltage with the reference voltage, as in the fourth embodiment. The comparison result of the comparator 43 is then used as the detection signal DS similar to that in the first embodiment. That is, the detection circuit 40 controls the current source IREFN and IREFP based on the comparison result of the divided power source voltage VCCQ and the reference voltage.

Consequently, the fully differential amplifier 11 according to the fifth embodiment can change the electric current distribution to the N-channel input section and the P-channel input section in accordance with the operation regions of the fully differential amplifier 11, as in the first and fourth embodiments. Therefore, as in the first and fourth embodiments, the fully differential amplifier 11 according to the fifth embodiment can inhibit the deterioration of the small signal gain and the signal band despite the fluctuation of the input common-mode voltage, and can therefore provide high-speed response and a high gain over a wide range of the power source voltage. Thus, the IREC 10 using the fully differential amplifier 11 according to the fifth embodiment can adapt to the high-speed operation of the semiconductor integrated circuit 1, as in the first and fourth embodiments.

The detection circuit 40 according to the fifth embodiment comprises, as in the fourth embodiment, the resistors R1 and R2 which divide the power source voltage VCCQ, and the comparator 43, and can thus be obtained with a simpler circuit than the detection circuit 40 according to the first embodiment. Therefore, the fully differential amplifier 11 according to the fifth embodiment can provide an amplifier circuit compatible with a wide range of input common-mode voltages at lower cost, as in the fourth embodiment.

[6] Modifications and Others

An amplifier circuit according to an embodiment includes first and second differential amplifier circuits. The first differential amplifier circuit <N-channel input section> includes a first transistor <31, FIG. 4> having a gate to which a first signal is input, a second transistor <32, FIG. 4> having a gate to which a second signal is input, a first electric current source <IREFN1, FIG. 4> which supplies an electric current to one end of the first and second transistors, and a second electric current source <IREFN2, FIG. 4> which supplies an electric current to one end of the first and second transistors via a first switch element <SW1, FIG. 4>. The second differential amplifier circuit <P-channel input section> includes a third transistor <33, FIG. 4> having a gate to which the first signal is input, a fourth transistor <34, FIG. 4> having a gate to which the second signal is input, a second electric current source <IREFP1, FIG. 4> which supplies an electric current to one end of the third and fourth transistors, and a second electric current source <IREFP2, FIG. 4> which supplies an electric current to one end of the third and fourth transistors via a second switch element <SW2, FIG. 4>. The first switch element is controlled by a third signal <DS, FIG. 4>. The second switch element is controlled by a fourth signal <BDS, FIG. 4>. The third signal and the fourth signal have a complementary relationship.

Consequently, it is possible to provide an amplifier circuit which can inhibit the deterioration of the small signal gain and the signal band despite the fluctuation of the input common-mode voltage.

Although the above embodiment has been described by the use of a memory system including a NAND type flash memory as one example of the semiconductor integrated circuit 1, it is not limited to this. For example, the fully differential amplifier 11 according to the above embodiment is also applicable to an input/output circuit in a non-volatile semiconductor memory such as a DRAM. The fully differential amplifier 11 according to the above embodiment may also be used in other semiconductor integrated circuits, and is applicable to an input/output circuit in any communication interface.

The embodiments described above can be implemented in combination as much as possible. For example, the detection circuit 40 controls a pair of switches SW to adjust the electric currents to be supplied to the N-channel input section and the P-channel input section of the fully differential amplifier 11 in the cases described by way of example in the fourth and fifth embodiments, but are not limited to this. For example, the fourth and fifth embodiments can be combined with the second and third embodiments. Specifically, the fully differential amplifiers 11 according to the fourth and fifth embodiments may control more current source by the detection circuit 40, in the same manner as the fully differential amplifier 11 described in the second embodiment, or may steplessly adjust the electric current supply amount by one electric current source in the same manner as the fully differential amplifier 11 described in the third embodiment.

The signal DQ and the reference voltage VREF are input to the fully differential amplifier 11 of the IREC 10 in the case described by way of example in the above embodiments, but are not limited to this. The signal input to the fully differential amplifier 11 of the IREC 10 can be variously modified. For example, the signal DQS and the signal DQSB that is a signal having a phase opposite to that of the signal DQS may be input to the fully differential amplifier 11. Thus, even when a fixed potential such as the reference voltage VREF is not used, the IREC 10 can apply the configuration and operation described in the above embodiments, and can amplify the signal input to the input/output terminal I/O.

In the present specification, "connection" means electric connection, and does not exclude, for example, the intervention of another element. Moreover, in the present specification, "cutoff" means that the relevant switch is in an off-state, and does not exclude, for example, the flow of a minute electric current such as a leak electric current of a transistor. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. An amplifier circuit comprising:
a first differential amplifier circuit including a first transistor having a gate to which a first signal is input, a second transistor having a gate to which a second signal is input, a first electric current source that supplies an electric current to the first and second transistors, and a second electric current source that is configured to supply an electric current to the first and second transistors via a first switch element;
a second differential amplifier circuit including a third transistor having a gate to which the first signal is input, a fourth transistor having a gate to which the second signal is input, a third electric current source that supplies an electric current to the third and fourth transistors, and a fourth electric current source that is configured to supply an electric current to the third and fourth transistors via a second switch element;
a detection circuit which outputs a third signal based on the first and second signals; and
a first inverter coupled between an output node of the third signal, and the second switch element,
wherein the first switch element is controlled by the third signal, the second switch element is controlled by a fourth signal, and the third signal and the fourth signal are complementary.

2. The circuit of claim 1, wherein the detection circuit generates a first voltage based on the first and second signals, and generates the third signal based on a comparison result of the generated first voltage and a second voltage.

3. The circuit of claim 2, wherein:
when the first voltage is higher than the second voltage, the third signal becomes a first logic level, and the first and second switch elements assume an on-state and an off-state, respectively, and
when the first voltage is less than or equal to the second voltage, the third signal becomes a second logic level different from the first logic level, and the first and second switch elements assume an off-state and an on-state, respectively.

4. The circuit of claim 1, further comprising:
a third electric current source that is configured to supply an electric current to the first and second transistors via a third switch element; and
a fourth electric current source that is configured to supply an electric current to the third and fourth transistors via a fourth switch element,
wherein the third switch element is controlled by a fifth signal, the fourth switch element is controlled by a sixth signal, and the fifth signal and the sixth signal are complementary.

5. The circuit of claim 4, wherein the detection circuit outputs the fifth signal based on the first and second signals, and the circuit further comprises:
a second inverter coupled between an output node of the fifth signal, and the fourth switch element.

6. The circuit of claim 5, wherein the detection circuit generates a first voltage based on the first and second signals, generates the third signal based on a comparison result of the generated first voltage and a second voltage, and generates the fifth signal based on a comparison result of the generated first voltage and a third voltage lower than the second voltage.

7. The circuit of claim 6, wherein:
when the first voltage is higher than the second voltage, the third and fifth signals become a first logic level, the first and third switch elements assume an on-state, and the second and fourth switch elements assume an off-state,
when the first voltage is less than or equal to the second voltage and is higher than the third voltage, the third signal becomes the first logic level and the fifth signal becomes a second logic level different from the first logic level, the first and fourth switch elements assume an on-state, and the second and third switch elements assume an off-state, and
when the first voltage is less than or equal to the third voltage, the third and fifth signals assume the second logic level, the first and third switch elements become an off-state, and the second and fourth switch elements assume an on-state.

8. The circuit of claim 1, wherein:
the first and second transistors are N-channel MOS transistors, and
the third and fourth transistors are P-channel MOS transistors.

9. The circuit of claim 1, further comprising:
a fifth transistor having one end coupled to one end of the first transistor;
a sixth transistor having one end coupled to one end of the second transistor;
a seventh transistor having a gate coupled to a gate and one end of the fifth transistor, and having the other end coupled to one end of the fourth transistor; and
an eighth transistor having a gate coupled to a gate and one end of the sixth transistor, and having the other end coupled to one end of the third transistor.

10. An amplifier circuit comprising:
a first differential amplifier circuit including a first transistor having a gate to which a first signal is input, a second transistor having a gate to which a second signal is input, a first electric current source that supplies an electric current to the first and second transistors, and a second electric current source that is configured to supply an electric current to the first and second transistors via a first switch element;
a second differential amplifier circuit including a third transistor having a gate to which the first signal is input, a fourth transistor having a gate to which the second signal is input, a third electric current source that supplies an electric current to the third and fourth transistors, and a fourth electric current source that is configured to supply an electric current to the third and fourth transistors via a second switch element;
a detection circuit which outputs a third signal based on a power source voltage; and
an inverter coupled between an output node of the third signal, and the second switch element,
wherein the first switch element is controlled by the third signal, the second switch element is controlled by a fourth signal, and the third signal and the fourth signal are complementary.

11. The circuit of claim 10, wherein the detection circuit includes first and second resistive elements coupled in series between a supply node of the power source voltage and a supply node of a ground voltage, and generates the third signal based on a comparison result of a first voltage that is a voltage at a node between the first resistive element and the second resistive element, and a second voltage.

12. The circuit of claim 11, wherein:
when the first voltage is higher than the second voltage, the third signal becomes a first logic level, and the first and second switch elements assume an on-state and an off-state, respectively, and
when the first voltage is less than or equal to the second voltage, the third signal becomes a second logic level different from the first logic level, and the first and second switch elements assume an off-state and an on-state, respectively.

13. The circuit of claim 10, wherein the power source voltage is an internal power source voltage of the amplifier circuit.

14. The circuit of claim 10, wherein the power source voltage is an external power source voltage of the amplifier circuit.

15. The circuit of claim 10, wherein:
the first and second transistors are N-channel MOS transistors, and
the third and fourth transistors are P-channel MOS transistors.

16. The circuit of claim 10, further comprising:
a fifth transistor having one end coupled to one end of the first transistor;
a sixth transistor having one end coupled to one end of the second transistor;
a seventh transistor having a gate coupled to a gate and one end of the fifth transistor, and having the other end coupled to one end of the fourth transistor; and an eighth transistor having a gate coupled to a gate and one end of the sixth transistor, and having the other end coupled to one end of the third transistor.

17. An amplifier circuit comprising:
a first differential amplifier circuit including a first transistor having a gate to which a first signal is input, a second transistor having a gate to which a second signal is input, and a first electric current source which supplies an electric current to the first and second transistors;
a second differential amplifier circuit including a third transistor having a gate to which the first signal is input, a fourth transistor having a gate to which the second signal is input, and a second electric current source which supplies an electric current to the third and fourth transistors; and
a detection circuit which generates a first voltage based on the first and second signals, the detection circuit including a first level shifter which controls the first electric current source based on the first voltage, and a second level shifter which controls the second electric current source based on the first voltage,
wherein:
the detection circuit is configured so that an electric current amount that is supplied to the first and second transistors by the first electric current source is greater than an electric current amount that is supplied to the third and fourth transistors by the second electric current source, when the first voltage is higher than a second voltage, and
the detection circuit is configured so that the electric current amount that is supplied to the third and fourth transistors by the second electric current source is greater than the electric current amount that is supplied to the first and second transistors by the first electric current source, when the first voltage is less than or equal to the second voltage.

18. The circuit of claim 17, wherein the detection circuit controls the first and second electric current sources so that the total of the electric current amount that is supplied to the first and second transistors by the first electric current source and the electric current amount that is supplied to the third and fourth transistors by the second electric current source is substantially constant.

19. The circuit of claim 17, wherein:
the first and second transistors are N-channel MOS transistors, and
the third and fourth transistors are P-channel MOS transistors.

20. The circuit of claim 17, further comprising:
a fifth transistor having one end coupled to one end of the first transistor;
a sixth transistor having one end coupled to one end of the second transistor;
a seventh transistor having a gate coupled to a gate and one end of the fifth transistor, and having the other end coupled to one end of the fourth transistor; and
an eighth transistor having a gate coupled to a gate and one end of the sixth transistor, and having the other end coupled to one end of the third transistor.

* * * * *